(12) United States Patent
Watanabe et al.

(10) Patent No.: US 6,380,710 B1
(45) Date of Patent: Apr. 30, 2002

(54) PHOTOVOLTAIC-CHARGED SECONDARY BATTERY DEVICE

(75) Inventors: Haruo Watanabe; Ritsuko Inoue; Koichiro Hinokuma, all of Kanagawa; Tomikazu Watanabe, Tokyo; Hiroshi Miyazawa, Kanagawa, all of (JP)

(73) Assignee: Sony Corporation, Tokyo (JP)

( * ) Notice: Subject to any disclaimer, the term of this patent is extended or adjusted under 35 U.S.C. 154(b) by 124 days.

(21) Appl. No.: 09/609,170

(22) Filed: Jun. 30, 2000

(30) Foreign Application Priority Data

| | | | |
|---|---|---|---|
| Jul. 9, 1999 | (JP) | | 11-195241 |
| Jul. 30, 1999 | (JP) | | 11-216798 |
| Sep. 3, 1999 | (JP) | | 11-250340 |
| Sep. 29, 1999 | (JP) | | 11-275919 |
| Sep. 29, 1999 | (JP) | | 11-275920 |

(51) Int. Cl.[7] ............................................. H01M 10/46
(52) U.S. Cl. ...................................... 320/101; 320/107
(58) Field of Search .............................. 370/101, 107; 429/9, 96; 136/291, 256, 243, 245

(56) References Cited

U.S. PATENT DOCUMENTS

| | | | | |
|---|---|---|---|---|
| 5,500,055 A | * | 3/1996 | Toyama et al. | 136/259 |
| 5,605,769 A | * | 2/1997 | Toms | 429/9 |
| 6,188,197 B1 | * | 2/2001 | Watanable et al. | 320/101 |

* cited by examiner

Primary Examiner—Peter S. Wong
Assistant Examiner—Lawrence Luk

(74) Attorney, Agent, or Firm—Sonnenschein, Nath & Rosenthal

(57) ABSTRACT

A photovoltaic-charged secondary battery device has a cylindrical core, a flexible photoelectric transducer sheet extractably rolled on the core, a chargeable/dischargeable storage battery, and a control circuit for controlling the charging and discharging operations of the storage battery. The photovoltaic-charged secondary battery device with the photoelectric transducer sheet fully rolled on the core generally exhibiting a substantially cylindrical form. The photovoltaic-charged secondary battery device further has a polymeric cover film formed on the light-receiving surface of the photoelectric transducer sheet. The polymeric cover film improves the durability of the photoelectric transducer sheet against repeated bending and sliding actions caused on the photoelectric transducer sheet. The photoelectric transducer sheet may be so arranged that, when the photoelectric transducer sheet is rolled on the core, the light-receiving surface faces outward of the roll. The photovoltaic-charged secondary battery device may have a cylindrical peripheral wall coaxial with the core and defining therebetween an annular space for accommodating the photoelectric transducer sheet rolled on the core. The photoelectric transducer sheet is retractable into and extractable from the annular space through a slit formed in the cylindrical peripheral wall member. The cylindrical peripheral wall member is rotatable relative to the core, so that the photoelectric transducer sheet can be retracted into the annular space and rolled on the core as the cylindrical peripheral wall member is rotated. The cylindrical peripheral wall member may have a plurality of projections formed on the inner surface thereof. The photovoltaic-charged secondary battery device may have a temperature-responsive mechanism operable to disconnect the storage battery from the electrical connection or to move the storage battery from a predetermined position.

38 Claims, 15 Drawing Sheets

PHOTOVOLTAIC-CHARGED SECONDARY BATTERY DEVICE

RELATED APPLICATION DATA

The present application claims priority to Japanese Application Nos. P11-195241 filed Jul. 9, 1999; P11-216798, filed Jul. 30, 1999; P11-250340 filed Sep. 3, 1999; P11-275919 filed Sep. 29, 1999; and P11-275920 filed Sep. 29, 1999 which applications are incorporated herein by reference to the extent permitted by law.

BACKGROUND OF THE INVENTION

1. Field of the Invention

The present invention relates to a photovoltaic-charged secondary battery device having a storage battery which is chargeable with electricity produced by a photoelectric transducer.

2. Description of the Related Art

In general, a photoelectric transducer is known and referred to as a solar battery, and converts photo energy such as solar energy into electric energy. Unlike conventional fossil fuels, photoelectric transducers do not produce emissions such as carbon dioxide, when generating electric energy from photo energy. Photoelectric transducers can generate electricity semi-permanently because they produce electric energy from solar energy which is the to be almost inexhaustible. Photoelectric transducers are therefore expected to find wider use and greater scale of use, from the global environmental point of view.

However, photoelectric transducers are in many cases do not suitably used as direct power supply of electric appliances, because they exhibit an ample variation of the output electric energy due to large change in the level of photo energy such as solar light which significantly varies according to time. Furthermore, in order for the photoelectric transducers to produce practically usable level of electric energy, large area must be available on such transducers for receiving light rays, because the photo energy such as solar energy is spatially distributed in a highly diluted manner. For these reasons, photoelectric transducers are used to provide only assisting electric power or to charge a storage battery from which electric energy is discharged for use.

In the meantime, current progress in various working and machining technologies have accelerated a trend towards miniaturization of electrical appliances, and various kinds of handy or portable or hand-held devices are becoming available. Such portable or hand-held devices usually operate with power supplied from a dry cell which is a handy and portable power supply.

Photovoltaic-chargeable secondary batteries, which combines the advantages of photoelectric transducers and the convenience of dry cells have been proposed as in Japanese Unexamined Patent Application Publication No. 63-314780 entitled battery and in Japanese Unexamined Patent Application Publication No. 2-73675 entitled cylindrical chargeable solar battery. Such a known photovoltaic-charged secondary battery device consolidates a power-generating photoelectric transducer and a storage battery as a chargeable/dischargeable element into the form of a standard cylindrical cell. Thus, ordinary electric appliances can be activated by electric power derived from photo energy.

Conventional photovoltaic-charged secondary batteries, however, have the following shortcomings. Firstly, it is impossible to use the entire surfaces of the storage battery as the light-receiving surface, because photo energy such as solar energy is usually impinges upon the battery only in one direction. Further, it is impossible to increase the area of the light-receiving surface beyond the total outer surface area of the battery. Consequently, the known photovoltaic-charged secondary battery device requires impractically long charging time or even fails to produce electric energy required for sufficiently charging up the storage battery.

Under these circumstances, the inventors have made an intense study to invent a photovoltaic-charged secondary battery device in which a storage battery is combined with a flexible photoelectric transducer so as to make it possible to use, as a power supply of an ordinary electric appliance, power generated from photo energy such as solar energy. The inventors have filed a patent application on this invention and the application now bears Japanese Patent Application No. 10-351505. Thus, the inventors have succeeded in developing a photovoltaic-charged secondary battery device which has practically satisfactory charging performance and which can suitably be used as power supply of ordinary electric appliances.

However, this photovoltaic-charged secondary battery device still requires improvements in some respects. One major problem is that the photoelectric transducer tends to be damaged and deteriorated in a short time, so that the overall power generating efficiency and, hence, the charging performance are undesirably impaired. This is attributable to the fact that the flexible photoelectric transducer undergoes frequent straightening to develop a large light-receiving area to charge up the battery and, in some cases, frictional contact with other part of the secondary battery device.

Another deficiency to be eliminated is that not a negligible portion of the photoelectric transducer in the unrolled state is shaded to fail to receive light rays, though other portions are sufficiently irradiated with light rays. The shaded portions cannot efficiently generate electric energy, so that the overall power generating efficiency and, hence, the charging performance are impaired.

Still another problem is as follows. The photoelectric transducer has the form of a photoelectric transducer sheet composed of a flexible carrier sheet or substrate and a plurality of photoelectric transducer elements arranged on the sheet. When the photoelectric transducer sheet is unrolled to develop a large light-receiving area, a large external force is applied to the photoelectric transducer sheet. The inventors have found that such a large external force is necessary to overcome resistance which is generated as a result of frictional engagement between the sheet and other parts of the secondary battery device. Repeated application of such a large external force accelerates damaging and deterioration of the photoelectric transducer, resulting in a reduced overall power generating efficiency and, therefore, in inferior charging performance.

A further problem to be solved is as follows. When charging the storage battery, the photoelectric transducer sheet is unrolled to develop a large area for receiving solar light rays. The photovoltaic-charged secondary battery device placed under the sunshine may be heated up to an extraordinary high temperature, posing a risk of blow-off of an internal gas or electrolyte to blow off due to excessive rise of the pressure inside the storage battery. This risk cannot be completely avoided even when users are adequately cautioned, although the probability of occurrence of such n accident is very small. It is therefore necessary to take a measure to protect the photovoltaic-charged secondary battery device against an excessive temperature rise of the storage battery.

Accordingly, an object of the present invention is to provide a photovoltaic-charged secondary battery device having a photoelectric transducer sheet carrying a photoelectric transducer formed thereon and combined with a storage battery, wherein the photoelectric transducer sheet has flexibility and durability sufficient to ensure high charging performance against repeated use.

A second object of the present invention is to provide a photovoltaic-charged secondary battery device having a flexible photoelectric transducer sheet carrying a photoelectric transducer formed thereon, a storage battery, and a peripheral wall member which protects the photoelectric transducer sheet, thereby offering charging performance which is practically satisfactory and which can be maintained for a long time against repeated use.

A third object of the present invention is to provide a photovoltaic-charged secondary battery having a photoelectric transducer sheet which is uncoiled and extracted from a core so as to be exposed to light rays, the transducer sheet generating electrical energy with which a storage battery is charged, wherein the durability of the photoelectric transducer sheet is improved against repeated recoiling and uncoiling, thereby ensuring high and long-lasting power generating efficiency of the photoelectric transducer sheet and, hence, excellent charging performance over a long period of use.

A fourth object of the present invention is to provide a photovoltaic-charged secondary battery device which adopt a safety measure against the use under an unexpectedly high-temperature environment. More specifically, the fourth object is to provide a photovoltaic-charged secondary battery device having a flexible photoelectric transducer sheet and a storage battery to be charged with electric energy generated by the flexible photoelectric transducer sheet, wherein, when the secondary battery device has been heated to an extraordinarily high temperature, electrical connection between the storage battery and an associated member or mechanism is automatically broken or, alternatively, the storage battery is automatically ejected from the secondary battery device. Thus, the forth object is aimed at providing a photovoltaic-charged secondary battery device that can be used safely without any risk of damaging and breakdown of the storage battery, and without causing contamination of environment.

In accordance with a first aspect of the present invention, there is provided a photovoltaic-charged secondary battery device comprising: a cylindrical core; a flexible photoelectric transducer sheet extractably rolled on the core; a chargeable/dischargeable storage battery; and a control circuit for controlling the charging and discharging operations of the storage battery; the photovoltaic-charged secondary battery device with the photoelectric transducer sheet fully rolled on the core generally exhibiting a substantially cylindrical form; the photovoltaic-charged secondary battery device further comprising a polymeric cover film formed on at least the light-receiving surface of the photoelectric transducer sheet.

With these features, it is possible to obtain a photovoltaic-charged secondary battery device which maintains high charging performance for a long time against repeated use, by virtue of the combination between the flexible and durable photoelectric transducer sheet and a storage battery.

Preferably, the photoelectric transducer sheet has a plurality of photoelectric transducer elements formed thereon and arranged in parallel with the longitudinal axis thereof, the photoelectric transducer elements being electrically connected in series one to another. This feature eliminates any reduction in the overall power generating efficiency of the photoelectric transducer sheet which hitherto has been unavoidable due to the fact that part of the photoelectric transducer sheet fails to receive light rays as it remains inside the photovoltaic-charged secondary battery device without being fully extracted.

It is also preferred that the storage battery is accommodated in a space inside the core, and that, when the photoelectric transducer sheet is fully rolled on the core, the photovoltaic-charged secondary battery device generally has dimensions and shape of a predetermined cylindrical standard battery.

The storage battery preferably has a discharge voltage which is not less than 0.6 V and not higher than 1.9 V.

The storage battery is preferably detachable from the space in the core.

The aforementioned first object of the present invention can also be achieved by a second aspect of the present invention. According to the second aspect of the present invention, there is provided a photovoltaic-charged secondary battery device comprising: a cylindrical core; a flexible photoelectric transducer sheet extractably rolled on the core; a chargeable/dischargeable storage battery; and a control circuit for controlling the charging and discharging operations of the storage battery; the photovoltaic-charged secondary battery device with the photoelectric transducer sheet fully rolled on the core generally exhibiting a substantially cylindrical form; wherein the photoelectric transducer sheet is arranged such that, when the photoelectric transducer sheet is rolled on the core, a light-receiving surface of the photoelectric transducer sheet faces outward of the roll.

With these features, it is possible to obtain a photovoltaic-charged secondary battery device which maintains high charging performance for a long time against repeated use, by virtue of the combination between the flexible and durable photoelectric transducer sheet and a storage battery.

Preferably, this photovoltaic-charged secondary battery device further comprises a polymeric cover film formed on at least the light-receiving surface of the photoelectric transducer sheet. Such a polymeric cover film effectively suppresses damaging and deterioration of photoelectric transducer elements on the photoelectric transducer sheet.

Preferably, the photoelectric transducer sheet has a plurality of photoelectric transducer elements formed thereon and arranged in parallel with the longitudinal axis thereof, the photoelectric transducer elements being electrically connected in series one to another. This feature eliminates any reduction in the overall power generating efficiency of the photoelectric transducer sheet which hitherto has been unavoidable due to the fact that part of the photoelectric transducer sheet fails to receive light rays as it remains inside the photovoltaic-charged secondary battery device without being fully extracted.

Preferably, the storage battery is accommodated in a space inside the core. It Is also preferred that, when the photoelectric transducer sheet is fully rolled on the core, the photovoltaic-charged secondary battery device generally has dimensions and shape of a predetermined cylindrical standard battery.

The storage battery preferably has a discharge voltage which is not less than 0.6 V and not higher than 1.9 V. It is also preferred that the storage battery is detachable from the space in the core, and that the storage battery has the dimensions and the shape of a predetermined cylindrical standard battery.

In order to achieve the aforesaid second object of the present invention, according to a third aspect of the present invention, there is provided a photovoltaic-charged secondary battery device comprising: a cylindrical core; a flexible photoelectric transducer sheet extractably rolled on the core; a chargeable/dischargeable storage battery; and a control circuit for controlling the charging and discharging operations of the storage battery; the photovoltaic-charged secondary battery device with the photoelectric transducer sheet fully rolled on the core generally exhibiting a substantially cylindrical form, wherein the photovoltaic-charged secondary battery device further comprises: substantially flat, disk-shaped upper and lower flanges provided on both ends of the core; and a peripheral wall member disposed between and rotatably supported by the upper and lower flanges, the peripheral wall member and the core defining therebetween an annular space for accommodating the photoelectric transducer sheet rolled on the core, the peripheral wall member having a slit through which the photoelectric transducer sheet is extracted and retracted, such that rotation of the peripheral wall member causes the photoelectric transducer sheet to be retracted into the annular space and rolled on the core, the photoelectric transducer sheet having an inner end region having a length large enough to space the inner end of effective photovoltaic portion of the photoelectric transducer sheet to be sufficiently spaced apart from the slit when the photoelectric transducer sheet is extracted from the annular space.

In the known photovoltaic-charged secondary battery device, a problem is encountered in that the overall power generating efficiency of the photoelectric transducer sheet is deteriorated due to the fact that part of the photovoltaic portion of the photoelectric transducer sheet is shaded to fail to receive sufficient light rays. This problem is overcome by the above-described feature of the third aspect of the present invention.

It is preferred that, when the photoelectric transducer sheet is fully rolled on the core, the photovoltaic-charged secondary battery device generally has dimensions and shape of a predetermined cylindrical standard battery.

It is also preferred that the storage battery has a discharge voltage which is not less than 0.6 V and not higher than 1.9 V, and that the storage battery is detachable from the core.

In order to achieve the aforementioned third object of the present invention, in accordance with a fourth aspect of the present invention, there is provided a photovoltaic-charged secondary battery device comprising: a cylindrical core; a flexible photoelectric transducer sheet extractably rolled on the core; a chargeable/dischargeable storage battery; and a control circuit for controlling the charging and discharging operations of the storage battery; the photovoltaic-charged secondary battery device with the photoelectric transducer sheet fully rolled on the core generally exhibiting a substantially cylindrical form; the photovoltaic-charged secondary battery device further comprising: substantially flat, disk-shaped upper and lower flanges provided on both ends of the core; and a peripheral wall member disposed between and rotatably supported by the upper and lower flanges, the peripheral wall member and the core defining therebetween an annular space for accommodating the photoelectric transducer sheet rolled on the core, the peripheral wall member having a slit through which the photoelectric transducer sheet is extracted and retracted, such that rotation of the peripheral wall member causes the photoelectric transducer sheet to be retracted into the annular space and rolled on the core, the peripheral wall member further having a plurality of projections on the inner surface thereof.

A photovoltaic-charged secondary battery device as a modification of this fourth aspect of the present invention which comprises: a cylindrical core; a flexible photoelectric transducer sheet extractably rolled on the core; a chargeable/dischargeable storage battery; and a control circuit for controlling the charging and discharging operations of the storage battery; the photovoltaic-charged secondary battery device with the photoelectric transducer sheet fully rolled on the core generally exhibiting a substantially cylindrical form; the photovoltaic-charged secondary battery device further comprising: substantially flat, disk-shaped upper and lower flanges provided on both ends of the core; and a peripheral wall member disposed between and rotatably supported by the upper and lower flanges, the peripheral wall member and the core defining therebetween an annular space for accommodating the photoelectric transducer sheet rolled on the core, the peripheral wall member having a slit through which the photoelectric transducer sheet is extracted and retracted, such that rotation of the peripheral wall member causes the photoelectric transducer sheet to be retracted into the annular space and rolled on the core, the photoelectric transducer sheet having a plurality of projections formed on the surface thereof facing the inner surface of the peripheral wall member.

In accordance with the fourth aspect of the present invention, the photoelectric transducer sheet can be extracted while causing the surface of the photoelectric transducer sheet sliding on the apices of the projections formed on the inner surface of the peripheral wall member, without allowing the sheet to make a surface-to-surface contact therewith. In the modification, the photoelectric transducer sheet can be extracted with the projections formed thereon sliding on the inner surface of the peripheral wall member, without making a surface-to-surface contact therewith. This eliminates the necessity of applying an impractically large puling force on the photoelectric transducer sheet, unlike the known photovoltaic-charged secondary battery device, thus avoiding damaging or rapid deterioration of the photoelectric transducer sheet attributable to the application of large pulling force. It is also to be noted that, in the fourth aspect of the invention, the dynamic frictional force acting between the photoelectric transducer sheet and the projections on the inner surface of the peripheral wall member is significantly smaller than that developed in the known photovoltaic-charged secondary battery device due to the surface-to-surface contact therebetween. Likewise, in the modification, the dynamic frictional force acting between the photoelectric transducer sheet and the projections on the photoelectric transducer sheet and the inner surface of the peripheral wall member is significantly smaller than that developed in the known photovoltaic-charged secondary battery device due to the surface-to-surface contact therebetween. This also contributes to prevention of damaging of the photoelectric transducer sheet.

Thus, the fourth aspect and the modification overcomes the problem of the known art: namely, reduction in the overall power generating efficiency of the photoelectric transducer sheet and a consequent reduction in the charging performance attributable to the application of a large pulling force on the photoelectric transducer sheet.

It is preferred that, when the photoelectric transducer sheet is fully rolled on the core, the photovoltaic-charged secondary battery device generally has dimensions and shape of a predetermined cylindrical standard battery. It is also preferred that the storage battery has a discharge voltage which is not less than 0.6 V and not higher than 1.9 V. The storage battery is preferably detachable from the core. In the fourth aspect of the invention, the photoelectric transducer sheet is preferably arranged such that, when it is rolled on the core, its light-receiving surface faces inward of the roll. In contrast, in the modification, the projections are formed on the surface of the photoelectric transducer sheet opposite to the light-receiving surface, and the photoelectric transducer sheet is rolled such that its light-receiving surface faces inward of the roll.

In order to achieve the aforementioned fourth object of the present invention, in accordance with a fifth aspect of the present invention, there is provided a photovoltaic-charged secondary battery device comprising: a cylindrical core; a flexible photoelectric transducer sheet extractably rolled on the core; a detachable storage battery chargeable through the photoelectric transducer sheet and capable of discharging; a control circuit for controlling the charging and discharging operations of the storage battery; and a temperature-responsive mechanism; the photovoltaic-charged secondary battery device with the photoelectric transducer sheet fully rolled on the core generally exhibiting a substantially cylindrical form; the temperature-responsive mechanism being operable to break electrical connection between the storage battery and an associated member when the temperature thereof has been raised to a predetermined high temperature.

A photovoltaic-charged secondary battery device as an alternative arrangement of the fifth aspect comprises: a photovoltaic-charged secondary battery device comprising: a cylindrical core; a flexible photoelectric transducer sheet extractably rolled on the core; a detachable storage battery chargeable through the photoelectric transducer sheet and capable of discharging; a control circuit for controlling the charging and discharging operations of the storage battery; and a temperature-responsive mechanism; the photovoltaic-charged secondary battery device with the photoelectric transducer sheet fully rolled on the core generally exhibiting a substantially cylindrical form; the temperature-responsive mechanism being operable to cause the storage battery to be moved apart from a predetermined position when the temperature thereof has been raised to a predetermined high temperature.

In accordance with a practical form of the fifth aspect of the present invention, there is provided a photovoltaic-charged secondary battery device which comprises: a cylindrical core 2; a flexible photoelectric transducer sheet 3 which is extractably rolled on the core 2; a detachable and dischargeable/chargeable storage battery 4 chargeable through the photoelectric transducer sheet 3; and a control circuit 5 for controlling the discharging and charging operations. The photovoltaic-charged secondary battery device generally exhibits a substantially cylindrical form when the photoelectric transducer sheet 3 is fully rolled on the core 2. The photovoltaic-charged secondary battery device 1 further comprises a conductive spring 31 provided at one axial end of the core 2 and held in electrical connection with one 9 (or 8) of the two electrode terminals of the photovoltaic-charged secondary battery device; a battery insert hole 91 formed in the other axial end of the core 2; a lid mount member 9a provided on the edge of the battery insert hole 91 and serving also as the other 9 (or 8) of the electrode terminals of the photovoltaic-charged secondary battery device; a lid member 92 made of an electrically conductive material and hinged to the lid mount member 9a; and an electrically conductive lid locking member 93 attached to the lid mount member 9a and reversibly deformable in response to change in temperature; wherein the storage battery 4 is accommodated in a space defined in the core 2 with the lid member 92 locked in a closing position by the lid locking member 93, such that one 4a (or 4b) of its electrode terminals is pressed by the spring 31 while the other 4b (or 4a) of the electrode terminals held in electrical connection with the other 9 (or 8) of the electrode terminals of the photovoltaic-charged secondary battery device via the lid member or via the lid locking mechanism 93, the lid locking mechanism being thermally deformable to unlock the lid member 92 when the temperature thereof has been raised to a predetermined temperature.

In accordance with the first embodiment and its modification described above, when the temperature of the photovoltaic-charged secondary battery device has been raised to an abnormally high level, electrical connection between the photovoltaic-charged secondary battery device and associated member or mechanism is automatically broken or, alternatively, the storage battery is automatically ejected from the photovoltaic-charged secondary battery device. It is therefore possible to prevent damaging or breakdown of the photovoltaic-charged secondary battery device and associated devices, while preventing contamination of environment.

In the practical embodiment of the photovoltaic-charged secondary battery device in accordance with the fifth aspect, the spring 31 provided on one axial end of the core 2 constantly urges the storage battery 4, tending to eject the storage battery 4 from the space inside the core 2 through the battery insert hole 91. When the temperature of the photovoltaic-charged secondary battery device and, hence, of the storage battery 4 has been raised to an abnormally high temperature, the lid locking mechanism 33 is thermally deformed to unlock the lid member 92, thereby the storage battery 4 is forced out of the core by the force of the spring 31. This results in (1) automatic breakage of the electrical connection between the photovoltaic-charged secondary battery device and associated member or mechanism or, alternatively, automatic ejection of the storage battery from the photovoltaic-charged secondary battery device. It is therefore possible to prevent damaging or breakdown of the photovoltaic-charged secondary battery device and associated devices, while preventing contamination of environment.

Preferably, when the photoelectric transducer sheet is fully rolled on the core, the photovoltaic-charged secondary battery device generally has dimensions and shape of a predetermined cylindrical standard battery. It is also preferred that the storage battery has a discharge voltage which is not less than 0.6 V and not higher than 1.9 V. It is also preferred that the storage battery has the dimensions and shape of a predetermined cylindrical standard battery. The lock mechanism used in the practical embodiment described before is preferably constituted by a leaf-spring-shaped member formed from a bimetal composed of a shape memory alloy and an alloy which has high resiliency.

The above and other objects, features and advantages of the present invention will become clear from the following description of the preferred embodiments when the same is read in conjunction with the accompanying drawings.

BRIEF DESCRIPTION OF THE DRAWINGS

FIGS. 6A and 6B show a second embodiment of the photovoltaic-charged secondary battery device of the first aspect, wherein FIG. 6A is a longitudinal sectional view, while FIG. 6B is a cross-sectional view of the device in a state in which the photoelectric transducer sheet has been unrolled and developed;

FIGS. 13A and 13B show a photovoltaic-charged secondary battery device in accordance with the fourth aspect of the present invention, wherein FIG. 13A is a longitudinal sectional view, while FIG. 13B is a cross-sectional view in a state in which a photoelectric transducer sheet has just started to be unrolled and developed;

FIGS. 20A and 20B show the structure of a photovoltaic-charged secondary battery device as a first embodiment of the fifth aspect of the present invention, wherein FIG. 20A is a cross-sectional view of the entire structure of the photovoltaic-charged secondary battery device, taken along the line XXa—XXa of FIG. 20B, while FIG. 20B is a bottom plan view of the photovoltaic-charged secondary battery device;

FIGS. 22A and 22B are longitudinal sectional views of the photovoltaic-charged secondary battery device shown in FIGS. 20A and 20B in different states, wherein FIG. 22A shows a state in which a storage battery is normally set in the photovoltaic-charged secondary battery device, while FIG. 22B shows a state in which the storage battery has been ejected such that a portion of the storage battery projects out of the photovoltaic-charged secondary battery device; and FIGS. 23A and 23B are longitudinal sectional views of a photovoltaic-charged secondary battery device as a second embodiment of the fifth aspect of the present invention, wherein FIG. 22A shows a state in which a storage battery is normally set in the photovoltaic-charged secondary battery device, while FIG. 22B shows a state in which the storage battery has been ejected such that a portion of the storage battery projects out of the photovoltaic-charged secondary battery device.

DESCRIPTION OF THE PREFERRED EMBODIMENTS

Figure 1:
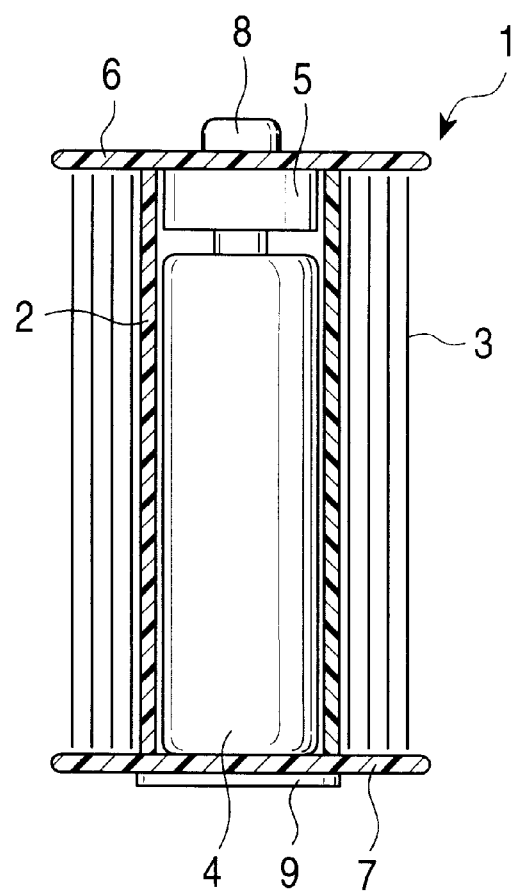
FIG. 1 is a longitudinal sectional view of a photovoltaic-charged secondary battery device in accordance with the first and second aspects of the present invention.
Figure 2:
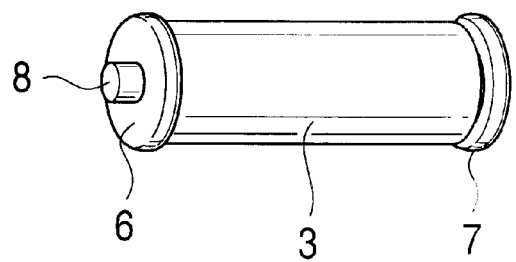
FIG. 2 is a perspective view of the photovoltaic-charged secondary battery device of FIG. 1.
Figure 3:
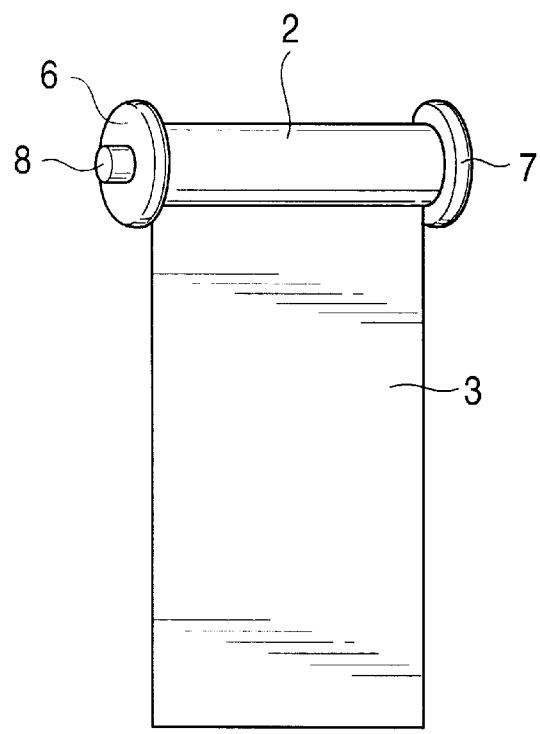
FIG. 3 is a perspective view of the photovoltaic-charged secondary battery device of FIG. 1 in a charging mode.

Referring to FIGS. 1 to 8, a photovoltaic-charged secondary battery device 1 in accordance with the first aspect of the present invention has a cylindrical core 2, a flexible photoelectric transducer sheet 3 wound on the core 2 and adapted to be unrolled therefrom, a storage battery 4 provided in the core 2, and a control circuit 5. As will be seen from FIGS. 1 and 2, the photovoltaic-charged secondary battery device presents a generally cylindrical form when the photoelectric transducer sheet 3 has been fully wound on the core 2. As shown in FIG. 3, the photoelectric transducer sheet 3, when unrolled from the core 2 and developed, is exposed to light rays so as to generate electricity with which the storage battery 4 is charged.

The core 2 is formed from, for example, ABS resin so as to have a cylindrical shape. The core 2 has an axial length slightly greater than the width of the photoelectric transducer sheet 3 wound thereon. Therefore, the photovoltaic-charged secondary battery device 1 accommodates the full width of the photoelectric transducer sheet, without allowing the sheet 3 to project beyond the either axial end of the core 2. An upper flange 6 and a lower flange 7 are provided both ends of the core 2.

The upper and lower flanges 6 and 7 are formed in a substantially circular disk-like form from a material similar to that of the core 2, and are fixed to the respective ends of the core 2 by suitable means such as an adhesive, although these flanges 6 and 7 may be formed integrally with the core 2.

The upper and lower flanges 6 and 7 have a diameter which is substantially the same as or slightly greater than the diameter of the photoelectric transducer sheet 3 fully wound on the core 2. Thus, the upper and lower flanges 6 and 7 protect the edges of the photoelectric transducer sheet 3 and serves as guides for the photoelectric transducer sheet 3 when the unrolled sheet 3 is retracted and rewound onto the core 2, whereby the photoelectric transducer sheet 3 can be correctly rolled on the core 2 without axial deviation.

Preferably, the core 2 and the upper and lower flanges 6 and 7 are formed from an electrically insulating material or materials, for otherwise troubles may occur such as short-circuiting of internal wiring through these flanges or short-circuiting of an electrical appliance on which the photovoltaic-charged secondary battery device is used, due to contact of the flanges with terminals of the battery space of the electrical appliances.

It is also preferred that the core 2 and the upper and lower flanges 6 and 7 are made from a material or materials which excel in heat insulating nature. When the photovoltaic-charged secondary battery device is left in extremely hot environment, e.g., on a dashboard of an automobile, the storage battery 4 may rise abnormally high, leading to a rupture of the photovoltaic-charged secondary battery device. The use of a heat-insulating material effectively serves to suppress such an abnormal temperature rise.

The upper and lower flanges 6 and 7 are provided with a positive electrode 8 and a negative electrode 9, respectively. The positive and negative electrodes 8 and 9 are made of a dielectric material, and are connected to associated terminals of the control circuit 5 through electrical lines which are not shown.

Figure 4:
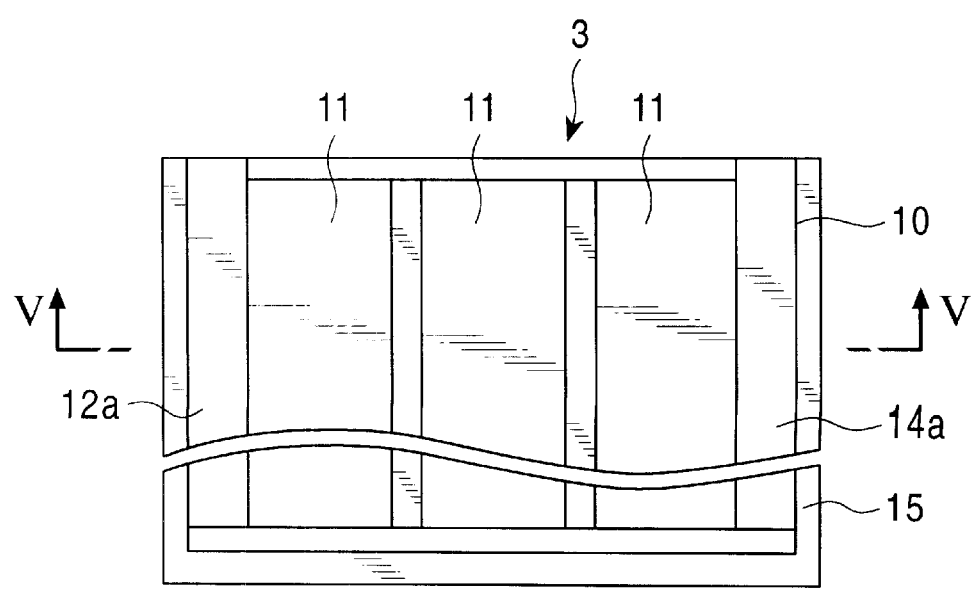
FIG. 4 is a plan view of a photoelectric transducer sheet used in the photovoltaic-charged secondary battery device of FIG. 1.
Figure 5:
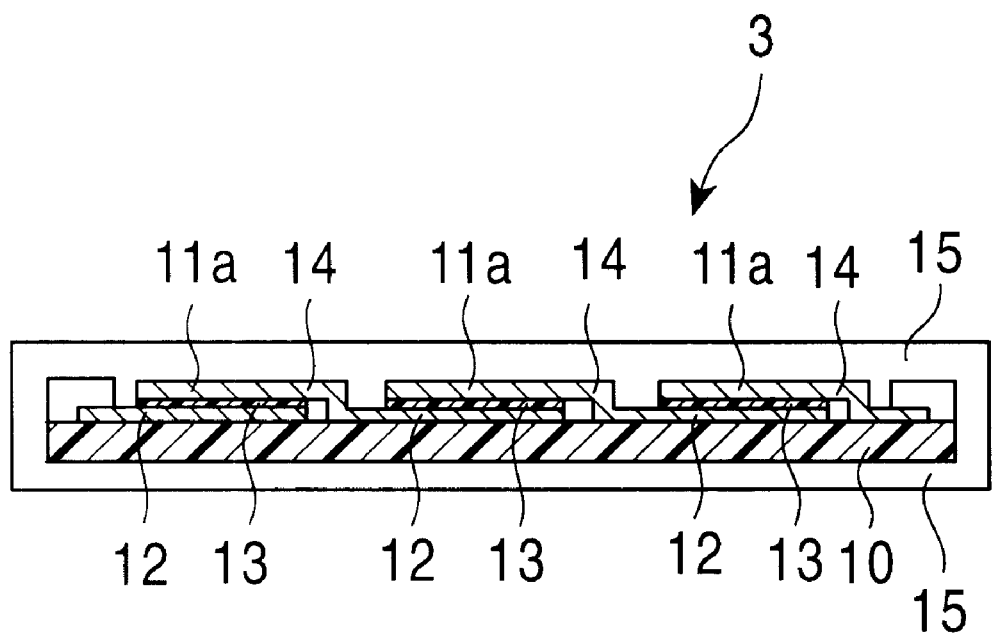
FIG. 5 is a sectional view taken along the line V—V of FIG. 4.

As will be seen from FIGS. 4 and 5, the photoelectric transducer sheet 3 has a flexible, substantially rectangular substrate sheet 10, a plurality of photoelectric transducer elements arranged on the substrate sheet 10, and a polymeric cover sheet 15. The flexible substrate sheet 10 is formed from an electrically insulating material such as polyester.

As will be best seen from FIG. 5, each photoelectric transducer element 11 has a first electrode layer 12 formed on the substrate sheet 10, a photoelectric conversion layer 13 formed on the first electrode layer 12, and a second electrode layer 14 formed on the photoelectric conversion layer 13. These layers 12, 13 and 14 are successively formed in the forms of thin films on the substrate sheet 10, by a suitable method such as a PVD method, typically sputtering or deposition, a CVD technique, typically plasma CVD or MOCVD technique, or the like. Each photoelectric conversion element 11 is flexible enough to follow flexure of the substrate sheet 10, because each layer of the photoelectric transducer element 11 is thin film.

The illustrated embodiment of the photovoltaic-charged secondary battery device further has the polymeric cover sheet 15 which also is flexible. The polymeric cover sheet overlies the light-receiving portions of the photoelectric transducer elements 11.

In this embodiment, it is essential that the polymeric cover sheet 15 be provided on the light-receiving side of the photoelectric transducer sheet 3. It is preferred that the polymeric cover sheet 15 be provided also on the back side of the photoelectric transducer sheet 3 opposite to the light-receiving side. With this arrangement, it is possible to suppress damaging or deterioration of the photoelectric transducer elements 11 attributable to repeated cycles of unrolling of the photoelectric transducer sheet 3 to develop a large light-receiving area and rewinding of the same onto the core 2. The provision of the polymeric cover sheet 15 also serves to suppress damaging or deterioration of the photoelectric transducer elements 11 attributable to repeated frictional sliding engagement between the photoelectric transducer sheet 3 and other stationary portion of the photovoltaic-charged secondary battery device. It is therefore possible to avoid reduction in the overall power generating efficiency of the photoelectric transducer elements and, hence, reduction in the charging performance. In other words, it is possible to achieve high power generating efficiency, which in turn offers superior charging performance.

The photoelectric transducer sheet 3 when left in the rolled state for a long time tends to exhibit so-called rolling habit due to plastic deformation of the sheet material. Such a rolling habit tends to impair the effective receipt of light by the photoelectric transducer sheet 3 the same is unrolled. It is to be appreciated that the polymeric cover sheet 15 serves to suppress such a plastic deformation of the sheet material, thus ensuring high light-receiving efficiency when the sheet is unrolled and developed. When the photoelectric transducer sheet 3 is clad with the polymeric cover sheets 15, both cover sheets 15 may be made of the same material or any suitable different materials may be used as necessary. However, the polymeric cover sheet 15 overlying the light-receiving side of the photoelectric transducer sheet 3 must be transparent at least at portions covering the photoelectric transducer elements 11. The polymeric cover sheet 15 also must be wear-resistant and should have weather resistance to withstand light and weather.

Examples of the material of the polymeric cover sheet 15 is a polymer of an olefin halide, in particular fluorinated olefin, and a copolymer of such an olefin halide and olefin. A bonding layer may be provided to fix the polymeric cover layer to the photoelectric transducer sheet. By way of example, a copolymer of ethylene and vinyl acetate may be used as the material of the bonding layer.

The photoelectric transducer elements 11 on the photoelectric transducer sheet 3 are electrically connected in series. A positive electrode terminal 12a and a negative electrode terminal 14a are respectively provided on the electrode layers of the photoelectric transducer elements 11 that are disposed on both breadthwise ends of the photoelectric transducer sheet 3. The positive electrode terminal 12a and the negative electrode terminal 14a are respectively connected to associated terminals of the control circuit 5. Preferably, the positive and negative electrode terminals 12a and 14a are covered by the polymeric cover sheet 15, so that these terminals are satisfactorily protected against damaging and deterioration attributable to repeated flexure of the photoelectric transducer sheet 3 carrying these terminals.

Each photoelectric transducer element 11 is arranged such that it receives light at its major surface 11a which is opposite to the substrate sheet 10, i.e., which faces outward. The first and second electrode layers 12 and 14 are made of a dielectric material, thus serving as a pair of electrodes on the photoelectric conversion layer 13. The photoelectric conversion layer 13 is formed of a film having so-called photovoltaic effect which produces photovoltaic power when irradiated with light rays such as solar light. A typical example of such a photovoltaic film is an amorphous semiconductor thin film represented by a pin junction of a-Si.

The photoelectric transducer sheet 13 may also be a pn junction of a p-type organic semiconductor such as perylene and an n-type organic semiconductor such as copper phthalocyanine. It is to be understood that the above-described materials of the photoelectric conversion layer 13 are only illustrative, and any other suitable materials may be used provided that they can provide sufficient flexibility and photovoltaic effect.

Preferably, the first electrode 12 is made of a metallic material such as Ag, Al, Cr, Ni or Cu, so as to exhibit high reflectivity to light rays received by the photoelectric conversion layer 13. Such an arrangement effectively allows the light rays transmitted through the photoelectric conversion layer 13 to be reflected and to impinge again onto the photoelectric conversion layer 13, thus improving the photovoltaic efficiency of the photoelectric conversion layer 13. On the other hand, the second electrode layer 14 is formed as so-called transparent electrode formed of a material containing as a major component a metallic oxide such as $SnO_2$ or $In_2O_3$. Such a transparent electrode efficiently transmits light to allow the light to reach the photoelectric conversion layer 13, thus offering higher photovoltaic efficiency.

In the arrangement shown in FIGS. 4 and 5, the first electrode 12 and the second electrode 14 are commonly used by plural adjacent photoelectric transducer elements 11. More specifically, the first electrode 12 of each photoelectric transducer element 11 is used as the second electrode 14 of an adjacent photoelectric transducer element 11 which is located at one side of the first-mentioned element 11, while the second electrode 14 is used as the first electrode 12 of the other adjacent photoelectric transducer element 11. It is thus possible to implement the series connection of adjacent photoelectric transducer elements 11.

The arrangement may be such that the first and second electrode layers 12 and 14 are made from a material mainly composed of a metallic oxide such as $SnO_2$ or $In_2O_3$ as mentioned before, while a reflective layer (not shown) made of, for example, a metallic material, is placed between the first electrode layer 12 and the substrate sheet 10. This arrangement permits the photoelectric transducer element 11 to receive sufficiently large quantity of light rays, through the second electrode layer 14 and from the reflective layer which underlies the photoelectric transducer element 11, thus achieving a high photovoltaic efficiency.

In this arrangement, the adjacent photoelectric transducer elements 11 are connected together through a "line contact" presented by the intervening electrode which extends along the photoelectric transducer elements substantially over the entire length of the photoelectric transducer elements 11. This effectively reduces the risk of breakage of electrical connection between the photoelectric transducer elements 11 which tends to occur when the connection between the adjacent photoelectric transducer elements is achieved through a "point-to-point" connection via lead wire. With this arrangement, therefore, electric power generated in the photoelectric transducer conversion layer 13 can be supplied through the positive and negative electrode terminals 12a and 14a with a high degree of reliability.

The photoelectric transducer elements 11 are laid to extend in parallel with the longitudinal axis of the photoelectric transducer sheet 3. In other words, the pair of electrodes of each photoelectric transducer element 11 is arranged to extend in parallel with the above-mentioned longitudinal axis. Therefore, even when part of the photoelectric transducer elements 11 fail to receive sufficiently large quantity of light rays when the photoelectric transducer sheet 3 has been unrolled and developed, reduction of overall power generating efficiency offered by the whole photoelectric transducer sheet 3 can be avoided.

The photoelectric transducer sheet 3 is rolled on the core 2 and can be unrolled therefrom. The end of the innermost turn of the photoelectric transducer sheet 3 is connected and fixed to the core 2. The aforesaid positive electrode terminal 12a and the negative electrode terminal 14a are provided on the end of the innermost turn.

In the illustrated embodiment, the photoelectric transducer sheet 3 is arranged such that its light-receiving surface faces inward when rolled on the core 2. This arrangement effectively protects the light-receiving surface from being damaged when the photovoltaic-charged secondary battery device 1 is used in discharging mode with the photoelectric transducer sheet 3 having been rolled on the core 2. It is thus possible to prevent reduction in the power generating efficiency which may occur due to damaging of the light-receiving surface or due to degradation in the light transmission when the photoelectric transducer sheet 3 is arranged to have its light-receiving surface facing outward of the roll.

However, it is not essential that the photoelectric transducer sheet 3 be rolled to have its light-receiving surface facing inward of the roll. Namely, the arrangement may be such that the photoelectric transducer sheet 3 is rolled on the core 2 such that the light-receiving surface faces outward of the roll. Such an arrangement permits the storage battery 4 to be charged without requiring unrolling and development of the photoelectric transducer sheet 3, i.e., with the photoelectric transducer sheet 3 remaining rolled on the core 2.

The storage battery 4 is accommodated in the space defined inside the core 2. The storage battery 4 is a secondary battery which performs repeated discharging and charging. Examples of secondary batteries suitably used are a nickel-hydrogen secondary battery, a nickel-cadmium secondary battery, a nickel-zinc secondary battery, a zinc-solver oxide secondary battery, and an iron-nickel secondary battery.

Among these secondary batteries, the nickel-hydrogen secondary battery is most suitably used as the storage battery 4, because this type of secondary battery exhibits high energy density per unit volume and advantageously meets the environmental requirements because it does not use a heavy meal such as lead and cadmium.

The storage battery 4 may be a standard dry cell having a predetermined standard battery configuration. Thus, the storage battery 4 may be a battery cell specified by standards such as IEC or JIS, for example, an R6 type battery referred to as "size AA dry cell", an R03 type battery referred to as "size AAA dry cell", an R1 battery referred to as "size AAAA dry cell", and R44 type battery and R1220 type battery which are referred to also as "button-type batteries". Use of such standard cells or batteries advantageously reduces the cost of production of the photovoltaic-charged secondary battery device 1.

From the viewpoint of storage capacity, however, the storage battery is preferably formed by directly confining a battery composition such as an electrolyte directly in the space inside the core 2, rather than by using a standard cell or battery. This arrangement permits the battery composition to fill up a space of a size which corresponds to outer dimensions of standard cells, thus increasing the storage capacity significantly.

The storage battery 4 also may be detachable from the core 2. For instance, the lower flange 7 may have a portion which can be opened to allow the storage battery to be put into and out of the core 2. Alternatively, the core 2 may have a portion which can be opened, so that the storage battery 4 is moved into and out of the core 2 after fully unrolling the photoelectric transducer sheet 3.

This arrangement permits the photovoltaic-charged secondary battery device 1 to be used for a long time, by replacing the battery 4 alone when it is exhausted. Other portions of the photovoltaic-charged secondary battery device 1 can inherently sustain longer use than the storage battery 4. The above-described arrangement enables these portions to be used again and again together with the new storage battery 4, without being disposed of. This offers a great advantage from the viewpoint of efficient use of resources.

It will be understood that the photovoltaic-charged secondary battery device 1 can be usable as a charger for charging a storage battery 4. Namely, a storage battery 4 after discharge can be recharged by the photovoltaic-charged secondary battery device 1 and, after the recharging, taken out of the photovoltaic-charged secondary battery device 1 and placed in an electric appliance so as to serve as a power supply of the electric appliance.

When a standard storage battery is used as the storage battery 4, such a standard battery also may be detachable from the core 2. Use of the standard cell or battery in the detachable manner permits easy replacement of the storage battery 4. The photovoltaic-charged secondary battery device 1 can be used as a charger for such a standard storage battery 4. The recharged standard storage battery 4 can be detached from the photovoltaic-charged secondary battery device 1 and placed in an electric appliance which is designed to operate by the power from such a standard storage battery.

Preferably, the discharge voltage of the storage battery 4 ranges from 0.6 V to 1.9 V. The photovoltaic-charged secondary battery device 1 may fail to activate an electric appliance designed for operation with an ordinary cylindrical standard battery, if the discharge voltage of the photovoltaic-charged secondary battery device 1 is too low. Conversely, a too high discharge voltage will cause breakdown of the electric appliance. Such troubles are avoided when the discharge voltage of the photovoltaic-charged secondary battery device falls within the range specified above.

The control circuit 5 is mounted in the space inside the core 2, as will be seen from FIG. 1. The control circuit 5 may have one or more functions selected from a rectification function for rectifying electrical current between the photoelectric transducer sheet 3 and the storage battery 4, an over-charge-prevention function for preventing overcharging of the storage battery 4, and an over-discharge-prevention function for preventing over-discharging from the storage battery 4. The control circuit 5 may be an electrical circuit which incorporates diodes and operation amplifiers and which provides the rectification function, over-discharge-prevention function or the over-discharge prevention function. Detailed description of such circuits is omitted because such circuits are generally used in electronic/electrical fields of industry.

The control circuit 5 has at least four terminals to which electrically connected are the positive and negative electrode terminals 12 and 14 of the photoelectric transducer sheet 3 and the positive and negative electrode terminals of the storage battery 4. The control circuit 5 serves to enable efficient charging of the storage battery 4 with the photoelectric transducer sheet 3 and efficient discharge from the storage battery 4.

The photovoltaic-charged secondary battery device 1 has the construction as described above, and presents a generally cylindrical when the photoelectric transducer sheet 3 is fully rolled on the core 2, as shown in FIG. 2. In this state, the photovoltaic-charged secondary battery device 1 can be detachably mounted on an electric appliance, so as to function as a power supply to the electric appliance.

Preferably, the dimensions and configuration of the photovoltaic-charged secondary battery device 1 are determined so as to conform to those of a standard cylindrical battery, when the photoelectric transducer sheet 3 is fully rolled on the core 2. Practically, the photovoltaic-charged secondary battery device 1 may have a configuration and dimensions conforming with those of a battery as specified by standards such as IEC and JIS, e.g., an R20 type battery generally referred to as unit cell, an R14 type battery generally referred to as size A cell, or an R6 type battery generally referred to as size AA cell.

Therefore, the photovoltaic-charged secondary battery device 1 of this embodiment can easily be used in an electronic appliance which is designed to accommodate an ordinary cylindrical standard battery. Thus, the photovoltaic-charged secondary battery device 1 converts light energy such as solar energy into electrical energy and stores the electrical energy to activate an electrical appliance designed to operate with power of an ordinary cylindrical standard battery.

In a battery charging mode of operation of the photovoltaic-charged secondary battery device 1, the photoelectric transducer sheet 3 is unrolled from the photoelectric transducer core 2 and is laid and straightened, as shown in FIG. 3. Since the whole light-receiving surface of the photoelectric transducer sheet 3 can be directed to the source of the light rays, electrical power generation by the photoelectric transducer sheet 3 is enhanced, so that storage battery 4 can be charged up in a practically acceptable short time.

It is to be understood that the described embodiment does not pose any restriction on the configuration, number and mounting position of the storage battery 4. For instance, a single photovoltaic-charged secondary battery device 1 can have a plurality of pieces of storage batteries 4 which are supported and fixed by a resilient member such as a coiled spring or a leaf spring, so as not to be unintentionally moved within the photovoltaic-charged secondary battery device 1.

Further, it is not essential that the innermost turn of the photoelectric transducer sheet 3 be connected and fixed to the core 2. Thus, the photoelectric transducer sheet 3 may be detachable from the core 2 of the photovoltaic-charged secondary battery device 1. With this arrangement, any photoelectric transducer sheet 3 that has been physically or electrically damaged can be replaced with a new photoelectric transducer sheet 3. Thus, it is required only that the photoelectric transducer sheet 3 is connectable to the storage battery at least in the charging phase of operation of the photovoltaic-charged secondary battery device 1.

Second Embodiment of the First Aspect

Figure 6A:
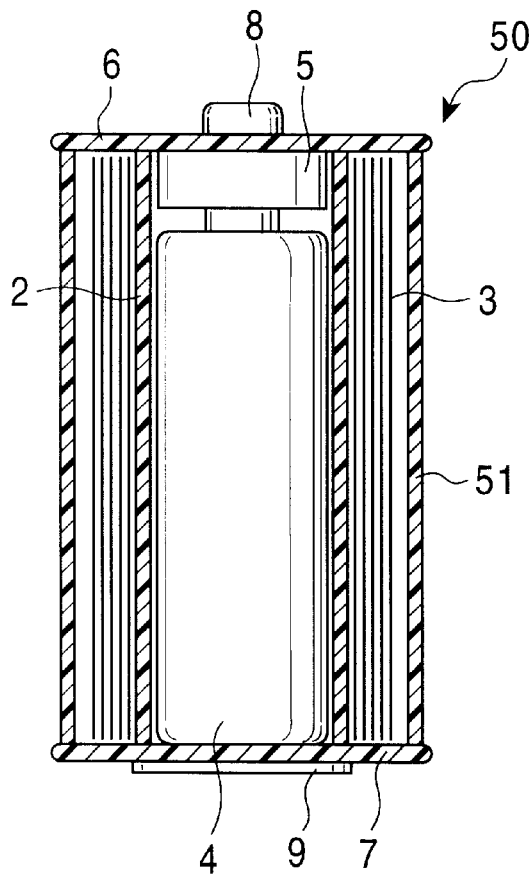
Figure 6B:
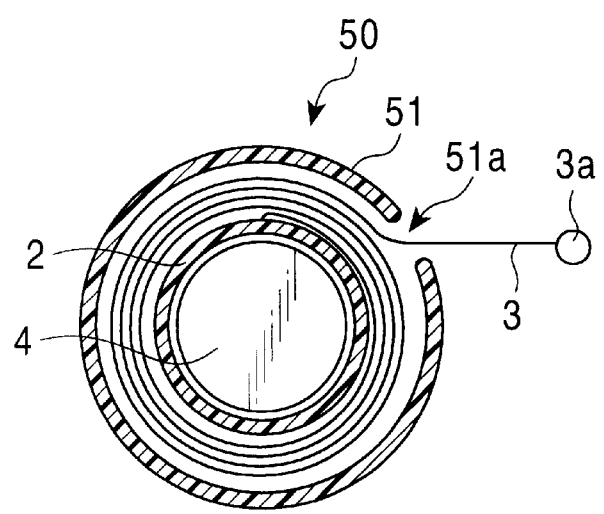
Figure 7:
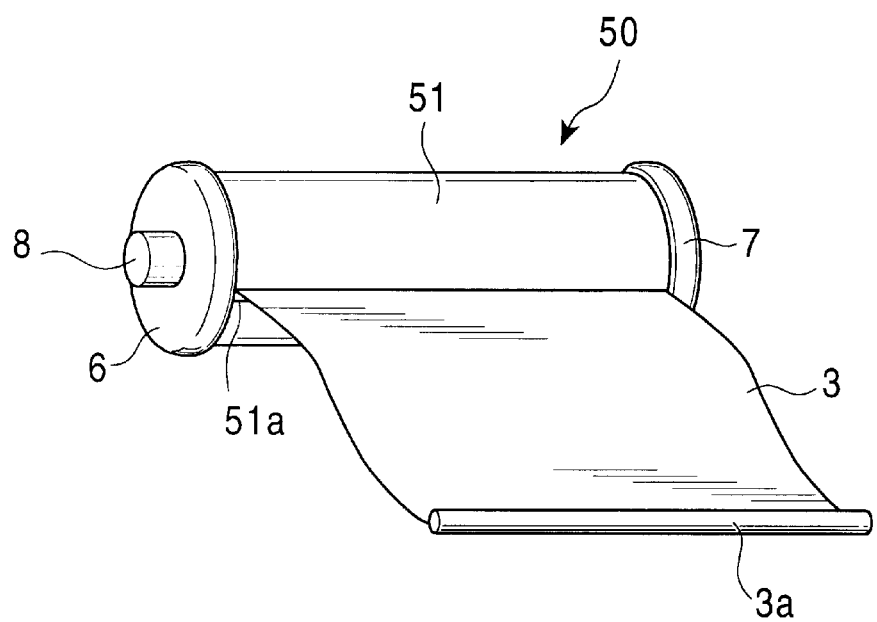
FIG. 7 is a perspective view of the photovoltaic-charged secondary battery device of FIG. 6 in a charging mode.
Figure 8:
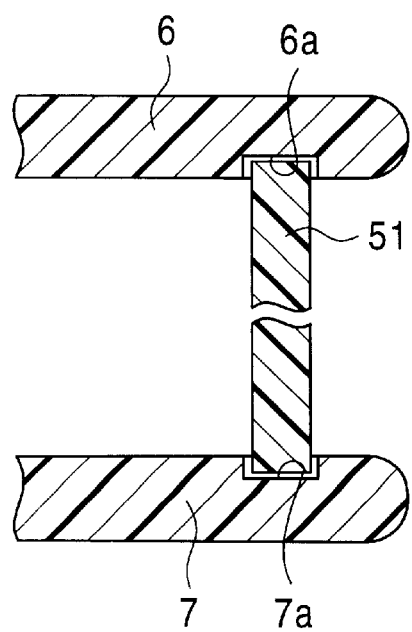
FIG. 8 is an enlarged longitudinal sectional view of the photovoltaic-charged secondary battery device of FIG. 6, showing particularly a critical portion thereof.

A second embodiment of the first aspect of the present invention will now be described with reference to FIGS. 6A to 8. FIGS. 6A and 6B show a second embodiment of the photovoltaic-charged secondary battery device of the first aspect, wherein FIG. 6A is a longitudinal sectional view, while FIG. 6B is a cross-sectional view of the device in a state in which the photoelectric transducer sheet has been unrolled and developed; FIG. 7 is a perspective view of the photovoltaic-charged secondary battery device of FIG. 6 in a charging mode; and FIG. 8 is an enlarged longitudinal sectional view of the photovoltaic-charged secondary battery device of FIG. 6, showing particularly a critical portion thereof. In these Figures, parts or components that are the same as those of the first embodiment are denoted by the same reference numerals as those used in the description of the first embodiment, and detailed description of such parts or components are omitted to avoid redundancy of the description.

Referring first to FIG. 6A, a photovoltaic-charged secondary battery device in accordance with the second embodiment, generally denoted by 50, has a generally cylindrical peripheral wall member 51 having a diameter substantially the same as that of the upper and lower flanges 6 and 7. As will be seen from FIG. 8, the upper and lower flanges 6 and 7 are respectively provided with annular grooves 6a and 7a which slidably receive the upper and lower edges of the peripheral wall 51, so that the peripheral wall member 51 is rotatable in one and the opposite directions relative to the core 2 and the upper and lower flanges 6 and 7.

The peripheral wall member 51 is provided with a longitudinal slit 51a formed therein. The length and the width of this slit 51a are large enough to allow the photoelectric transducer sheet to be extracted and retracted into and out of the space inside the peripheral wall member 51. The photoelectric transducer sheet 3 is provided at its outer end, i.e., at the leading end as viewed in the extracting direction, with a retainer portion 3a which has a thickness large enough to engage with the edges of the slit 51a when the photoelectric transducer sheet is rolled up on the core 2. Thus, the retainer portion 3a plays the double role of a stopper which prevents the photoelectric transducer sheet 3 from being fully retracted into the space inside the peripheral wall member 51 and a handle which can be pinched by user's fingers to allow an easy extraction of the photoelectric transducer sheet 3 from the space inside the peripheral wall member 51.

In the charging phase of operation of the photovoltaic-charged secondary battery device 50 for charging the storage battery 4, the user pinches the retainer portion 3a of the photoelectric transducer sheet 3 and pulls the same, so that the photoelectric transducer sheet is unrolled from the core 2 and extracted through the slit 51a of the peripheral wall member 51. It is possible to retract and roll the photoelectric transducer sheet 3 again on the core 2, by rotating the peripheral wall member 51 relative to the core 2.

It will be seen that the photovoltaic-charged secondary battery device 50 of this embodiment permits easy unrolling, i.e., extraction, and rolling, i.e., retraction, of the photoelectric transducer sheet 1, by virtue of the provision of the peripheral wall member 51 having the slit 51a. The peripheral wall member 51 also serves to prevent any loosening of the photoelectric transducer sheet 3 when the photovoltaic-charged secondary battery device 50 is accommodated in a battery space of an electrical appliance. Further, the peripheral wall member protects the photoelectric transducer sheet 3 against any damaging factor such as ambient dust and external shocks, while avoiding overheating of the storage battery which otherwise may occur due to direct exposure to solar light rays. In order to enhance the overheat prevention effect, it is desirable that the peripheral wall member 51 be colored in a color which absorbs less light and heat, e.g., a while color.

As will be understood from the foregoing description, the photovoltaic-charged secondary battery device of the first aspect of the present invention employs a combination of a storage battery and a flexible and durable photoelectric transducer sheet on which photoelectric transducer elements are formed, thus exhibiting charging performance which endures repeated use of the photovoltaic-charged secondary battery device. Thus, the photovoltaic-charged secondary battery device of the first aspect of the present invention enables the light energy derived from, for example, solar light rays to be practically used as the power for activating various electrical appliances, while avoiding environmental contamination due to noxious emissions and allowing efficient use of natural resources available on the earth.

The aforesaid first object of the present invention can also be achieved by a second aspect of the present invention which will now be described.

The photovoltaic-charged secondary battery device in accordance with the second aspect of the present invention has the basic structure which is materially the same as that of the first embodiment, but is characterized in that the light-receiving surface of the photoelectric transducer sheet 3, i.e., the surface on which the photoelectric transducer elements 11 are formed, faces outward of the roll of the photoelectric transducer sheet 3 on the core 2. Thus, the light-receiving surface of the photoelectric transducer sheet 3 is exposed to the exterior when the photovoltaic-charged secondary battery device is used in the charging mode with the photoelectric transducer sheet 3 rolled on the core 2. This involves a risk of damaging of the light-receiving surface, but such a risk is avoidable by, for example, providing a protective layer on the light-receiving surface of the photoelectric transducer sheet 3.

The inventors have found that the major factor of the deterioration of the photovoltaic-charged secondary battery device is the fatigue of the photoelectric transducer elements 11 caused by repeated bending and straightening caused by the cycles of rolling and unrolling. In order to reduce the deterioration, therefore, it is effective to reduce the magnitude of the change in the radius of curvature of the photoelectric transducer elements 11 sustained during repeated rolling and unrolling. From this point of view, it is preferred that the photoelectric transducer elements 11 are formed to face radially outward of the roll of the photoelectric transducer sheet 3 than to face radially inward of the same, because such an arrangement causes a smaller change in the radius of curvature of the photoelectric transducer elements 11. It has been also noted that the formation of the photoelectric transducer elements 11 on the substrate sheet 10 causes residual stress acting along the surface of the substrate sheet 10. This is attributable to the fact that the photoelectric transducer elements 11 are consecutively formed on the substrate sheet 10 while the latter is being continuously moved. Another factor of generation of the residual compression stress is physical and chemical effects acting on the interface between the photoelectric transducer elements 11 and the substrate sheet 10. In order to suppress deterioration of the photoelectric transducer elements 11 due to fatigue, it is quite effective to reduce the change in the radius of curvature sustained by the photoelectric transducer elements 11, particularly in the presence of the residual compression stress.

The photovoltaic-charged secondary battery device in accordance with the second aspect offers the same advantages as those produced by the first aspect and, in addition, presents its peculiar advantage, i.e., the greater effect of suppressing deterioration of the photoelectric transducer elements 11 caused by fatigue incurred during repeated rolling and unrolling of the photoelectric transducer sheet, by virtue of the feature that the light-receiving surface of the photoelectric transducer element faces outward of the roll of the photoelectric transducer sheet rather than facing inward of the same.

This peculiar effect is obtainable even when the photovoltaic-charged secondary battery device is devoid of polymeric cover sheet such as the sheet 15 used in the first aspect of the present invention. Thus, in the second aspect of the present invention, provision of the polymeric cover sheet is not essential.

A description will now be given of a third aspect of the present invention which achieves the aforesaid second object of the present invention.

The photovoltaic-charged secondary battery device shown in FIGS. 6A to 8 features the provision of the cylindrical peripheral wall member, besides the provision of the polymeric cover sheet formed on the photoelectric transducer sheet. It is to be understood, however, the cylindrical peripheral wall member by itself offers an advantage peculiar thereto. Thus, the photovoltaic-charged secondary battery device shown in FIGS. 6A to 8 produces an effect over the known arrangement, even when it is devoid of the polymeric cover sheet, thus presenting the third aspect of the present invention.

The photovoltaic-charged secondary battery device of the third aspect of the present invention will now be described with reference to FIGS. 9 to 12.

Figure 9:
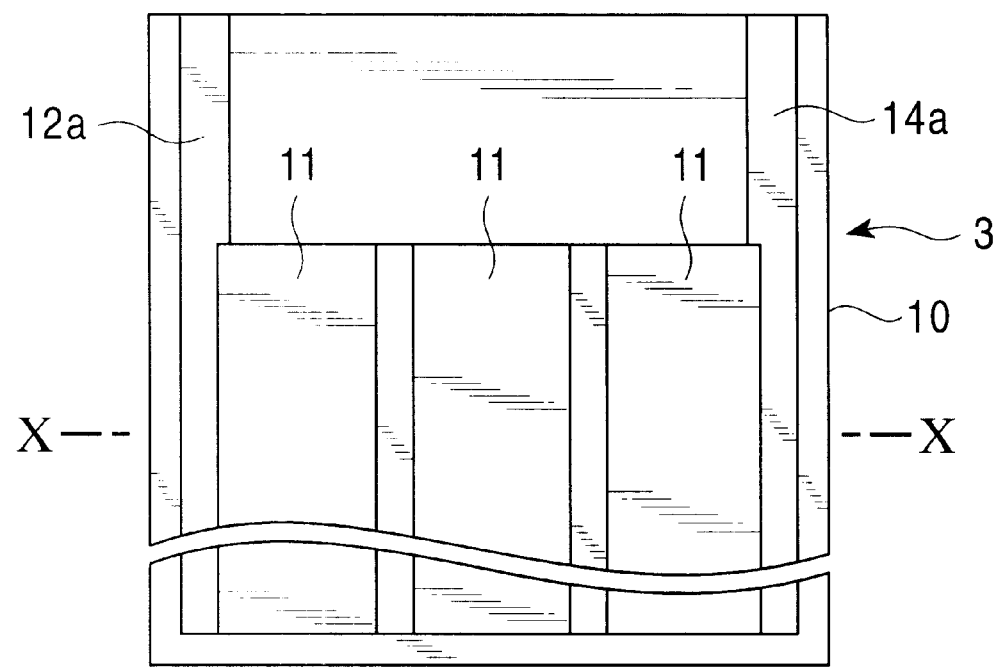
FIG. 9 is a plan view of a photoelectric transducer sheet used in a photovoltaic-charged secondary battery device in accordance with the third aspect of the invention.
Figure 10:
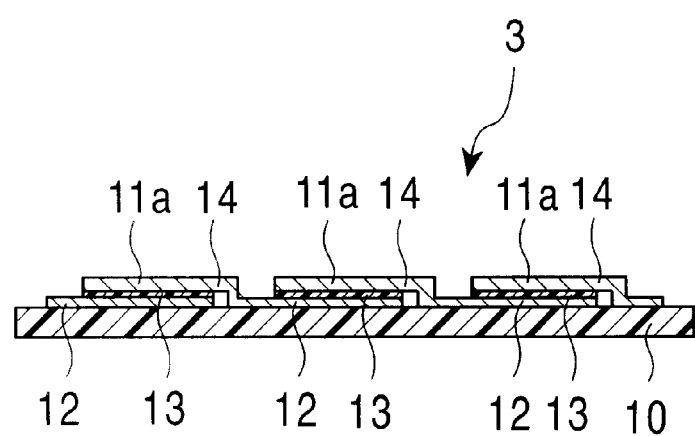
FIG. 10 is a sectional view taken along the line XX—XX of FIG. 9.

As will be seen from FIGS. 9 and 10, he photovoltaic-charged secondary battery device in accordance with the third aspect of the present invention has a photoelectric transducer sheet 3 which has a flexible rectangular substrate sheet 10 and a plurality of photoelectric transducer elements 11 formed thereon. The substrate sheet 10 is made of an insulating material such as polyester, and is configured to have a rectangular shape, as well as high flexibility. Thus, the photoelectric transducer sheet 3 is different from that shown in FIGS. 4 and 5 in that it is devoid of the polymeric cover film 15. This photoelectric transducer sheet 3 can be formed by a process which is basically the same as that used for the production of the photoelectric transducer sheet 3 shown in FIGS. 4 and 5.

The photoelectric transducer elements 11 on the photoelectric transducer sheet 3 are electrically connected in series. A positive electrode terminal 12a and a negative electrode terminal 14a are respectively provided on the electrode layers of the photoelectric transducer elements 11 that are disposed on both breadthwise ends of the photoelectric transducer sheet 3. The positive electrode terminal 12a and the negative electrode terminal 14a are respectively connected to associated terminals of the control circuit 5.

In the arrangement shown in FIGS. 9 and 10, the first electrode 12 and the second electrode 14 are commonly used by plural adjacent photoelectric transducer elements 11. More specifically, the first electrode 12 of each photoelectric transducer element 11 is used as the second electrode 14 of an adjacent photoelectric transducer element 11 which is located at one side of the first-mentioned element 11, while the second electrode 14 is used as the first electrode 12 of the other adjacent photoelectric transducer element 11. It is thus possible to implement the series connection of adjacent photoelectric transducer elements 11.

The photoelectric transducer sheet 3 is rolled on the core 2 and can be unrolled therefrom. The end of the innermost turn of the photoelectric transducer sheet 3 is connected and fixed to the core 2. The aforesaid positive electrode terminal 12a and the negative electrode terminal 14a are provided on the end of the innermost turn.

Figure 11:
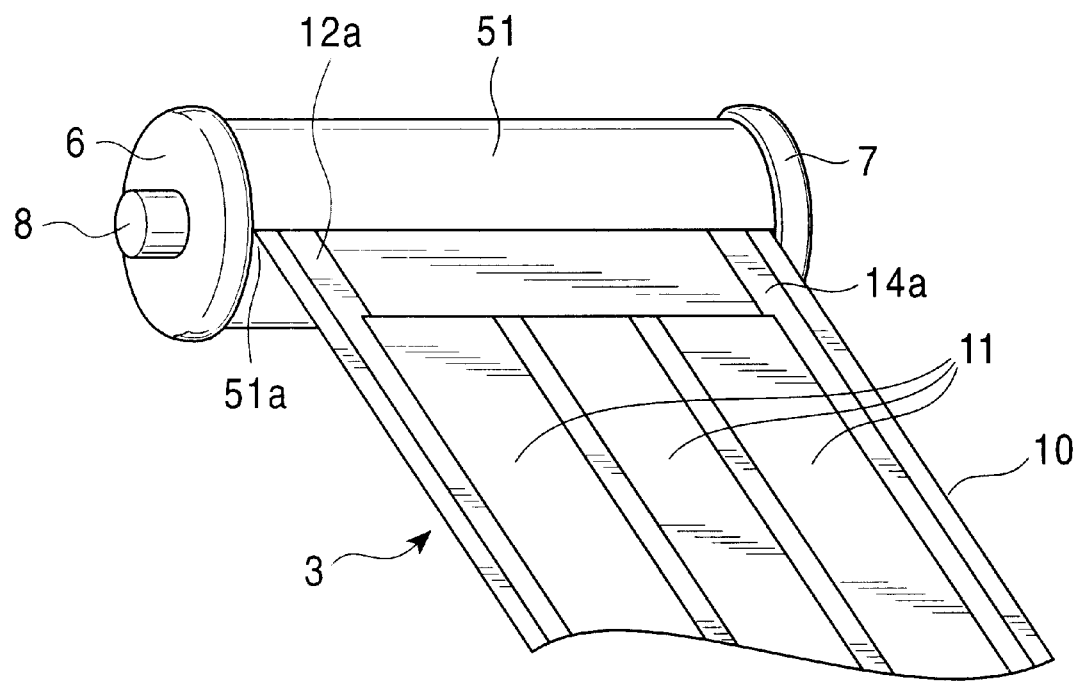
FIG. 11 is a perspective view of a photovoltaic-charged secondary battery device of FIG. 9, with a photoelectric transducer sheet fully unrolled and developed to receive light rays.
Figure 12:
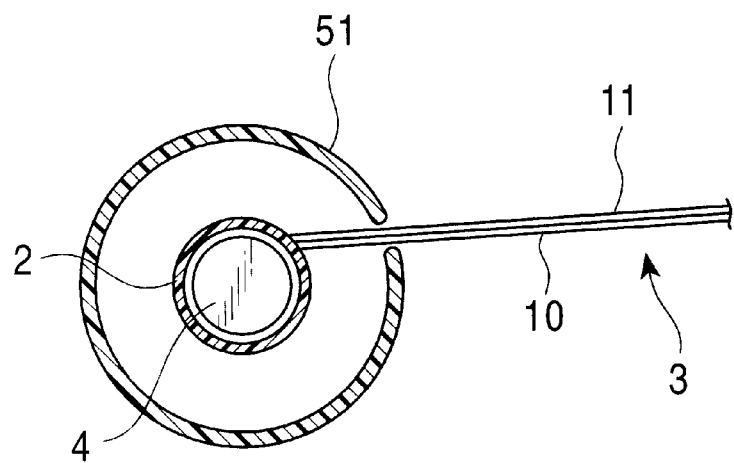
FIG. 12 is a cross-sectional view of the photovoltaic-charged secondary battery device shown in FIG. 11.

As will be seen from FIGS. 11 and 12, the photoelectric transducer sheet 3 has an innermost region which starts from the innermost end connected and fixed to the core 2 and ends at the portion where the inner ends of the photoelectric transducer sheets terminate. This innermost region does not carry the photoelectric transducer elements 11, although the positive electrode terminal 12a and the negative electrode terminal 14a extend over this innermost region. The innermost region of the photoelectric transducer sheet 3 ensures that the photoelectric transducer elements can be sufficiently spaced apart from the slit 51a of the peripheral wall member 50, when the photoelectric transducer sheet 3 has been fully unrolled and extracted.

This arrangement effectively prevents shading of the photoelectric transducer elements 11 by the peripheral wall member 51, so that the photoelectric transducer elements 11 can be fully exposed to the light rays. Further, deterioration of the photoelectric transducer elements 11 due to repeated flexing and straightening is suppressed, because the photoelectric transducer elements 11 are spaced from the inner end region where they must sustain a greater radius of curvature and shifted toward the outer end region where the radius of curvature sustained is smaller. In addition, the inner end region of the sheet devoid of the photoelectric transducer elements 11 has a higher flexibility than the region which carries the photoelectric transducer elements 11, thus providing a greater strength of connection of the photoelectric transducer sheet 3 to the core 2.

The innermost region of the sheet may be formed integrally with the photoelectric transducer sheet 3 or, alternatively, a separate sheet of the same or a different material may be connected to the photoelectric transducer sheet 3 to provide the aforesaid innermost region devoid of the photoelectric transducer elements 11.

The photovoltaic-charged secondary battery device of this embodiment is so arranged that the light-receiving surface of the photoelectric transducer sheet 3 faces radially inward when the photoelectric transducer sheet 3 is rolled on the core 2. This, however, is not essential and the arrangement may be such that the light-receiving surface of the photoelectric transducer sheet 3 faces radially outward, provided that the risk of damaging of the photoelectric transducer elements is negligibly small, as in the case of the photovoltaic-charged secondary battery device described before in connection with FIGS. 4 and 5.

Thus, the photovoltaic-charged secondary battery device of the third aspect of the present invention suppresses reduction in the power generating efficiency attributable to the shading of part of the photoelectric transducer elements by the cylindrical peripheral wall member, while reducing mechanical fatigue of the photoelectric transducer elements. It is also possible to improve durability of the connection of the photoelectric transducer sheet to the core. Consequently, the photovoltaic-charged secondary battery device of the third aspect enables practical use of light energy such as solar light energy as the power for activating electrical appliances, while avoiding environmental contamination due to noxious emissions and allowing efficient use of the limited natural resources available on the earth.

A description will now be given of a first embodiment and a second embodiment of the photovoltaic-charged secondary battery device in accordance with a fourth aspect of the present invention, with reference to FIGS. 13A to 19.

The structure, materials and the production process of the photovoltaic-charged secondary battery device of the fourth aspect may be basically the same as those of the embodiments described heretofore. In FIGS. 13A to 19, therefore, parts or components which are the same as those in the embodiments described before are denoted by the same reference numerals as those used in the description of the preceding embodiments, and detailed description of such parts or components is omitted to avoid redundancy of the description.

The photovoltaic-charged secondary battery device in accordance with the fourth aspect of the present invention has a combination of a storage battery and a photoelectric transducer sheet which is rolled on a core and which can be extracted and straightened to generate electric energy with which the storage battery is chargeable, wherein the durability of the photoelectric transducer sheet against repeated rolling and straightening is enhanced to ensure long-lasting high power generating efficiency, as well as high charging performance.

Figure 13A:
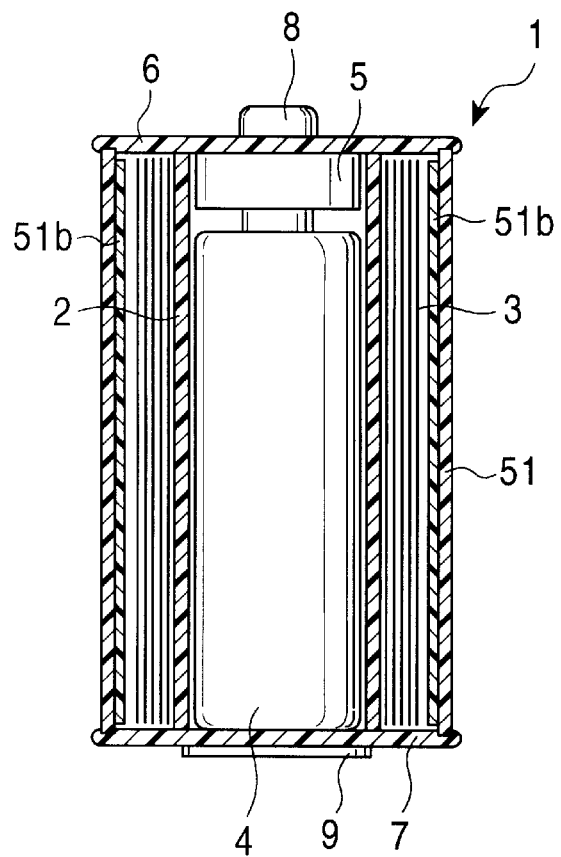
Figure 13B:
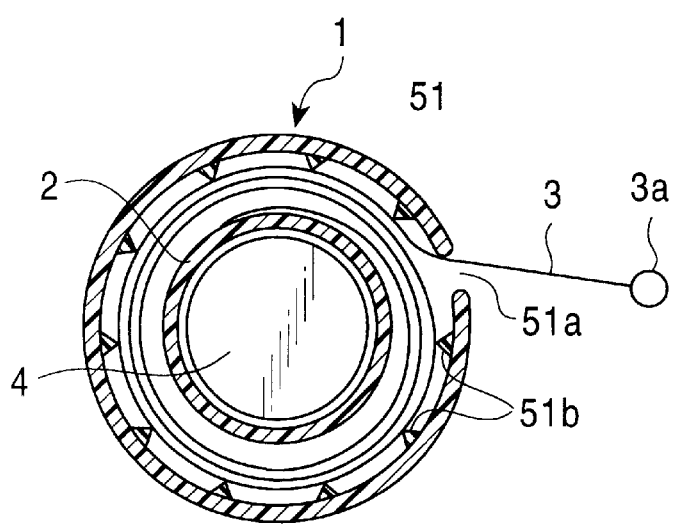
Figure 14:
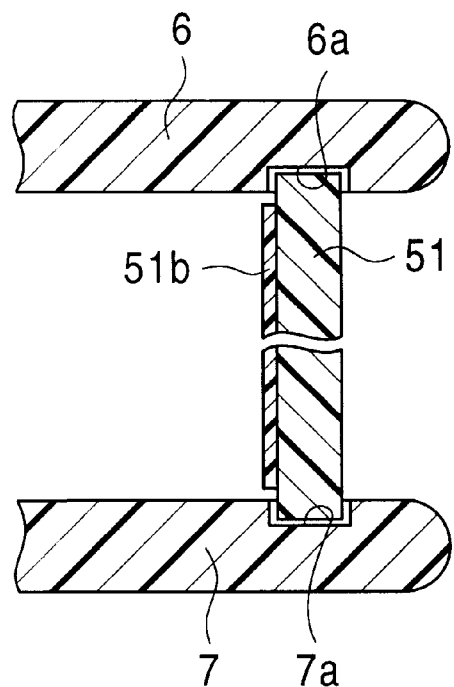
FIG. 14 is an enlarged longitudinal sectional view of the photovoltaic-charged secondary battery device, showing particularly the state of engagement between a peripheral wall member and upper and lower flanges of the photovoltaic-charged secondary battery device.
Figure 15:
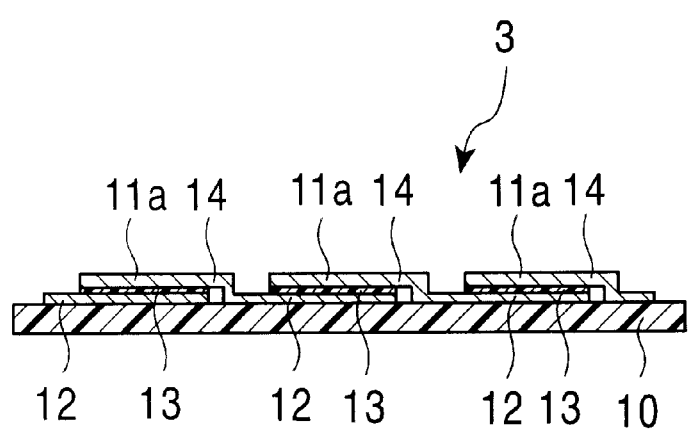
FIG. 15 is a sectional view of a photoelectric transducer sheet.
Figure 16:
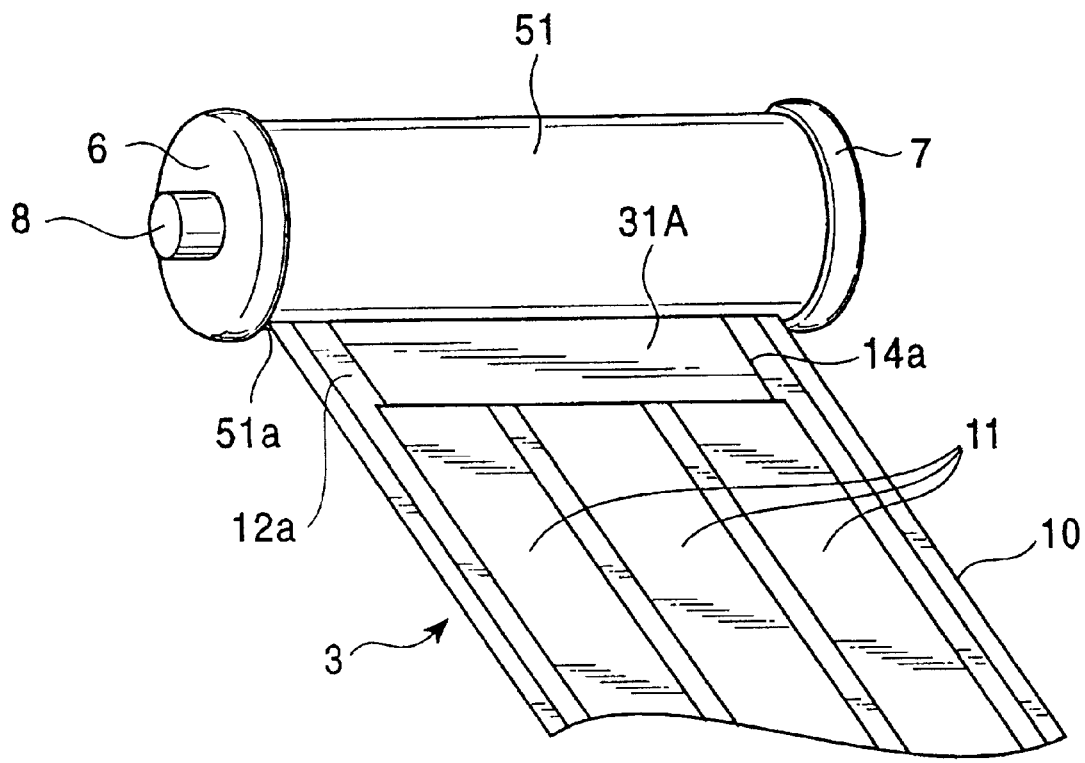
FIG. 16 is a perspective view of a photovoltaic-charged secondary battery device of FIG. 9, with a photoelectric transducer sheet fully unrolled and developed to receive light rays.
Figure 17:
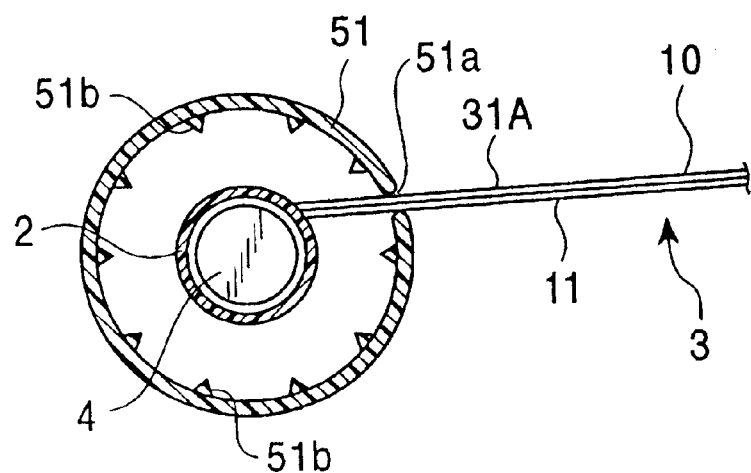
FIG. 17 is a cross-sectional view of the photoelectric transducer sheet of FIG. 16.

First Embodiment of the Photovoltaic-charged Secondary Battery Device of the Fourth Aspect FIG. 13A is a longitudinal sectional view of a photovoltaic-charged secondary battery device of the fourth aspect, while FIG. 13B is a cross-sectional view of the photovoltaic-charged secondary battery device with the photoelectric transducer sheet which has just started to be extracted from a space inside a peripheral wall member. FIG. 14 is an enlarged sectional view of the photovoltaic-charged secondary battery device, showing particularly the state of engagement between the peripheral wall member and upper and lower flanges. FIG. 15 is a sectional view of the photoelectric transducer sheet. FIG. 16 is a perspective view of the photovoltaic-charged secondary battery device with the photoelectric transducer sheet fully extracted and straightened. FIG. 17 is a sectional view of the photovoltaic-charged secondary battery device in the state shown in FIG. 16.

Referring to these Figures, the photovoltaic-charged secondary battery device 1 has a photoelectric transducer sheet 3 having photoelectric transducer elements 11 formed on the surface thereof which is opposite to the surface opposing the inner surface of the peripheral wall member 51. A plurality of stripe-like projections 51, each having a triangular cross-section, are formed on the inner surface of the peripheral wall member 51 at a predetermined circumferential pitch, so as to extend in the direction perpendicular to the direction of movement of the photoelectric transducer sheet 3.

In this photovoltaic-charged secondary battery device, the arrangement is such that, when the photoelectric transducer sheet 3 has been rolled on the core 2, the light-receiving surface of the photoelectric transducer sheet 3, i.e., the surface carrying the photoelectric transducer elements 11, faces inward of the roll, i.e., towards the core 2. Therefore, when the photoelectric transducer sheet is unrolled and extracted, the back surface of the sheet substrate 10, rather than the surface of the photoelectric transducer elements 11, slides on the projections 51b. With this arrangement, when the photovoltaic-charged secondary battery device is used in the discharging mode with the photoelectric transducer sheet 3 fully rolled on the core 2, the light-receiving surface of the photoelectric transducer sheet 3 is protected from damaging force.

However, it is not essential in the fourth aspect of the invention that the photoelectric transducer sheet 3 is rolled such that its light-receiving surface faces inward of the roll. Namely, if the risk of damaging of the light-receiving surface is negligibly small, the photoelectric transducer sheet 3 may be rolled on the core 2 such that its light-receiving surface faces outward of the roll.

Thus, in this embodiment, stripe-like projections 51b are formed on the inner surface of the peripheral wall member 51, the projections 51b having a triangular cross-section and extending in the transverse direction perpendicular to the direction of movement of the photoelectric transducer sheet 3 during rolling and unrolling. This provides an extended life of the photoelectric transducer sheet 3, thus overcoming the problem described below.

The present inventors have found that, in the known photovoltaic-charged secondary battery device, the rolled photoelectric transducer sheet 3 tends to be loosened and radially expanded into contact with the inner surface of the peripheral wall member 51, producing a large static frictional force between the photoelectric transducer sheet 3 and the peripheral wall member 51. When unrolling and extracting the sheet 3, therefore, a large pulling force has to be exerted to overcome the static frictional force, which undesirably damages the photoelectric transducer elements or shortens the life of the same. In order to obviate this problem, the photovoltaic-charged secondary battery device in accordance with the fourth aspect of the present invention is so arranged as to avoid frictional contact between the light-receiving surface of the photoelectric transducer sheet 3 and the inner surface of the peripheral wall member 41. Thus, the reverse side of the photoelectric transducer sheet opposite to the side carrying the photoelectric transducer elements slide on the apices of the projections 51b, without causing the light-receiving surface of the photoelectric transducer sheet 3 to be frictioned. It is also to be appreciated that the dynamic frictional force acting between the apices of the projections 51b and the photoelectric transducer sheet 3 is smaller than dynamic frictional force which would act when the photoelectric transducer sheet 3 makes a face-to-face contact with the inner surface of the peripheral wall member 51. This also contributes to the extension of the life of the photoelectric transducer sheet 3.

The stripe-like projections 51b may be substituted by dot-like or island-like projections. The stripe-like projections 51b also may be formed to run in the direction of extraction/retraction movement of the photoelectric transducer sheet 3, rather than in the transverse direction, or to run in a direction oblique to the direction of movement of the photoelectric transducer sheet 3, if such obliquely running projections can be formed without difficulty. The cross-section of the projection 51b may have a shape other than triangular shape, e.g., a circular shape or a shape which is a portion of an oval form. As will be seen from FIG. 15, the photoelectric transducer sheet 3 has a flexible substantially rectangular substrate sheet 10, and a plurality of photoelectric transducer elements 11 formed on one side of the substrate sheet 10. The substrate sheet 10 is made from an insulating material such as polyester, and has a rectangular shape, as well as high flexibility. When the photoelectric transducer sheet is unrolled and extracted, the surface of the photoelectric transducer sheet 3 opposite to the photoelectric transducer elements 11 slides on the apices of the projections 51b. The photoelectric transducer sheet 3 may be provided at its one or both sides with a polymeric cover sheet, similar to that described before in connection with FIGS. 4 and 5.

As will be seen from FIGS. 16 and 17, the arrangement is such that the inner ends of the photoelectric transducer elements 11 closer to the core 2 are positioned sufficiently spaced apart from the slit 51a of the peripheral wall member 51, when the photoelectric transducer sheet 3 has been unrolled and extracted to a length sufficiently large to receive light rays. More specifically, the photoelectric transducer sheet 3 has an inner end region 31A adjacent to the core 2 and devoid of the photoelectric transducer elements 41 but carrying the positive and negative electrode terminals 12a and 14a.

This arrangement effectively prevents the photoelectric transducer elements to be shaded, so as to allow the entirety of the photoelectric transducer elements 11 to receive light rays, when the photoelectric transducer sheet 3 has been extracted and developed to receive the light rays. Further, deterioration of the photoelectric transducer elements 11 due to repeated flexing and straightening is suppressed, because the photoelectric transducer elements 11 are spaced from the inner end region where they must sustain a greater radius of curvature and shifted toward the outer end region where the radius of curvature sustained is smaller. In addition, the inner end region of the sheet devoid of the photoelectric transducer elements 11 has a higher flexibility than the region which carries the photoelectric transducer elements 11, thus providing a greater strength of connection of the photoelectric transducer sheet 3 to the core 2. The innermost region of the sheet may be formed integrally with the photoelectric transducer sheet 3 or, alternatively, a separate sheet of the same or a different material may be connected to the photoelectric transducer sheet 3 to provide the aforesaid innermost region devoid of the photoelectric transducer elements 11.

As in the cases of the preceding embodiments, the photoelectric transducer sheet 3 may be rolled on the core 2 such that the light-receiving surface of the photoelectric transducer sheet 3 faces outward of the roll, provided that the risk of damaging of the light-receiving surface is negligibly small, although in FIGS. 16 and 17 the photoelectric transducer sheet 3 is rolled with its light-receiving surface directed inward of the roll.

Modification of the First Embodiment of the Fourth Aspect

Figure 18:
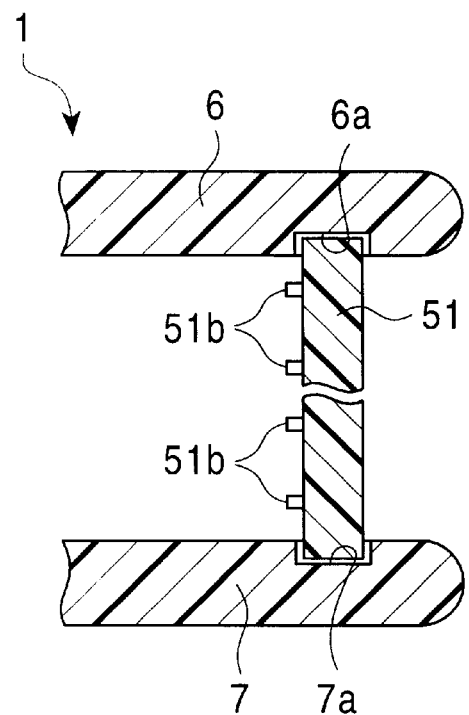
FIG. 18 is a sectional view showing the structure of a critical portion of the photovoltaic-charged secondary battery device which is another embodiment of the fourth aspect of the present invention.

FIG. 18 shows in sectional view a critical portion of a modification of the first embodiment of the photovoltaic-charged secondary battery device in accordance with the fourth aspect. In this modification, a plurality of stripe-like projections 51b are formed on the inner surface of the peripheral wall member 51, so as to extend in the direction of the sliding movement of the photoelectric transducer sheet 3, i.e., in the direction normal to the plane of FIG. 18. Other portions of this modification are the same as those of the first embodiment shown in FIGS. 16 and 17. This modification thus produces the same advantages as those offered by the first embodiment.

Second Embodiment of the Fourth Aspect

Figure 19:
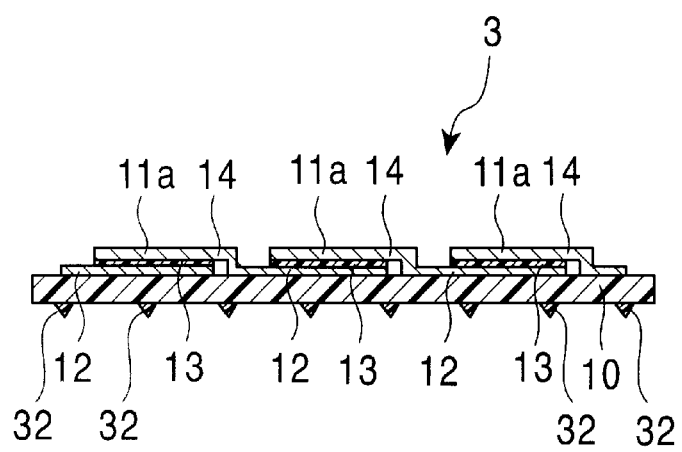
FIG. 19 is a cross-sectional view of a photoelectric transducer sheet in accordance with a third embodiment of the fourth aspect of the present invention.

FIG. 19 is a sectional view of a photoelectric transducer sheet 3 in accordance with a second embodiment of the fourth aspect of the present invention. As in the case of the embodiment shown in FIG. 16, the arrangement is such that the light-receiving surface of the photoelectric transducer sheet 3 carrying the photoelectric transducer elements 11 faces inward of the roll of the photoelectric transducer sheet 3 on the core 2, while the back side of the photoelectric transducer sheet 3, i.e., the surface of the substrate sheet 10 opposite to the photoelectric transducer elements 11, faces the inner surface of the peripheral wall member 51. In this photovoltaic-charged secondary battery device 1, a multiplicity of conically-shaped dots 32 are formed on the surface of the substrate sheet 10 opposite to the photoelectric transducer elements 11. It is to be noted, however, the projections 32 may be formed on the light-receiving surface of the photoelectric transducer sheet 3 and the photoelectric transducer sheet 3 may be rolled such that the light-receiving surface faces outward of the roll, if the risk of damaging or reduction in the power generating efficiency is negligibly small.

Obviously, the conical projections 32 may be substituted by hemispherical projections. It is also possible to form stripe-like projections on the surface of the substrate sheet 10 so as to extend in parallel with or transverse to the direction of sliding movement of the photoelectric transducer sheet 3. When such stripe-like projections are formed, the projection may also have a rectangular, triangular or a circular cross-section, as well as a cross-sectional shape which is part of an ellipse. The stripe-like projections also may be formed so as to extend in a direction oblique to the direction of sliding movement of the photoelectric transducer sheet 3, provided that such oblique projections can be formed easily.

As will be understood from the foregoing description, in accordance with the fourth aspect of the present invention, a plurality of projections are formed on the inner surface of the peripheral wall member, so that the photoelectric transducer sheet when unrolled from the core 2 and extracted slides on these projections. Alternatively, the projections are formed on the surface of the photoelectric transducer sheet 3 that faces the inner surface of the peripheral wall member, so that the projections slide on the inner surface of the peripheral wall member when the photoelectric transducer sheet is unrolled from the core 2 and extracted slides on these projections.

Thus, the photoelectric transducer sheet can be unrolled and extracted, as well as rolled and retracted, without allowing the photoelectric transducer sheet 3 to make surface-to-surface contact with the inner surface of the peripheral wall member. Therefore, the photoelectric transducer sheet can be extracted and retracted without being subjected to a large force, thus sustaining a longer use without deterioration. It will also be appreciated that the dynamic frictional force developed between the projections and the photoelectric transducer sheet during the sliding movement of the photoelectric transducer sheet is smaller than the dynamic frictional force which would be developed when the photoelectric transducer sheet makes a surface-to-surface contact with the inner surface of the peripheral wall member. This also contributes to the protection of the photoelectric transducer sheet against damaging, thus ensuring long-lasting high power generating efficiency, as well as superior charging performance.

A description will now be given of a photovoltaic-charged secondary battery device in accordance with a fifth aspect of the present invention, with reference to FIGS. 20A to 23B.

The fifth aspect of the present invention is aimed at providing a photovoltaic-charged secondary battery device which employs a safety measure against use under unexpectedly hot environment. More particularly, photovoltaic-charged secondary battery device in accordance with the fifth embodiment has a storage battery and a photoelectric transducer sheet for generating electricity for charging the storage battery, wherein, when the temperature of the photovoltaic-charged secondary battery device has been raised to predetermined temperature, the electrical connection between the storage battery and an associated member or mechanism is automatically broken or, alternatively, the storage battery is automatically ejected from the photovoltaic-charged secondary battery device thereby preventing damaging or breakdown of the photovoltaic-charged secondary battery device and associated member or mechanism, while avoiding contamination of environment. Thus, the photovoltaic-charged secondary battery device of the fifth aspect can be used with increased safety.

First Embodiment of the Fifth Aspect

Figure 20A:
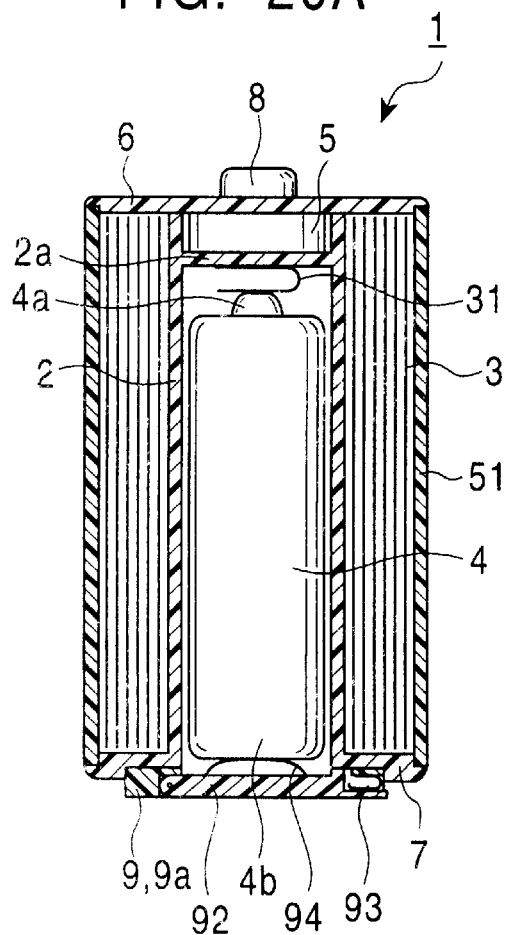
Figure 20B:
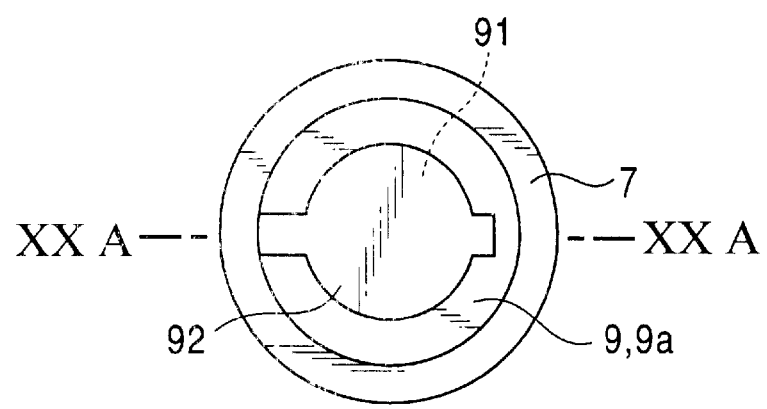
Figure 21:
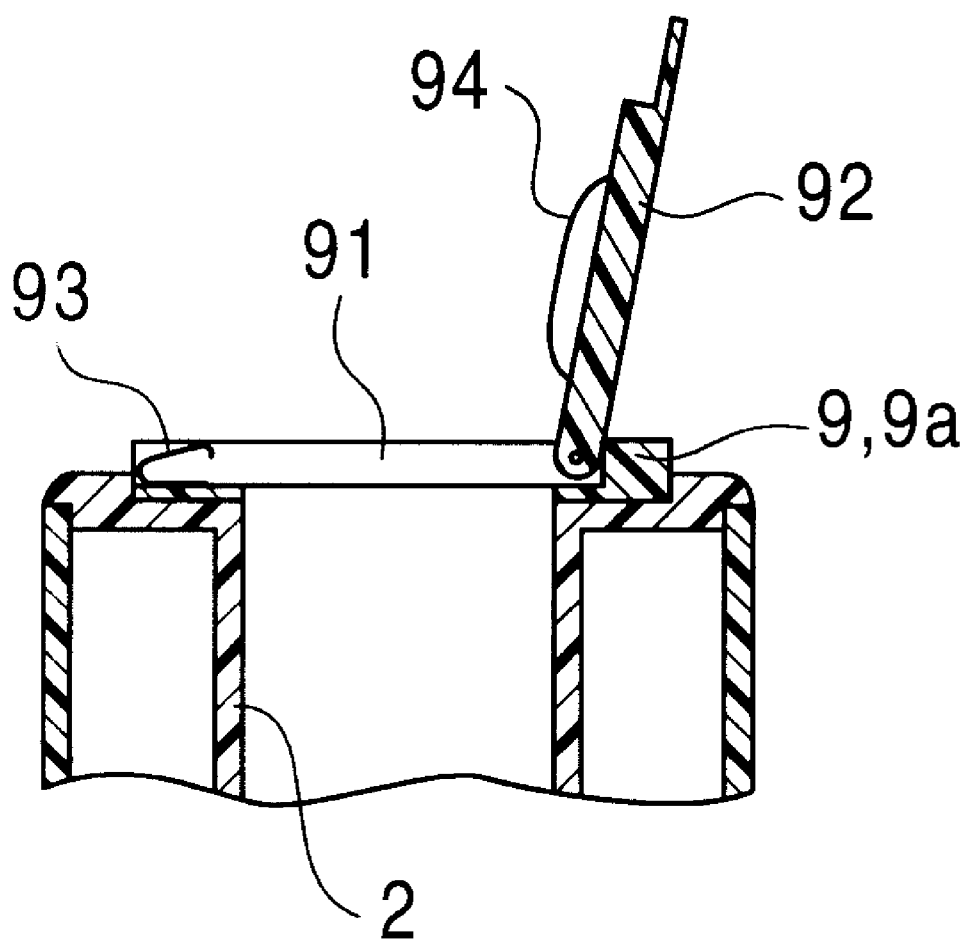
FIG. 21 is a longitudinal sectional view showing the structure of a critical portion of the photovoltaic-charged secondary battery device shown in FIGS. 20A and 20B, with a bottom lid opened.
Figure 22A:
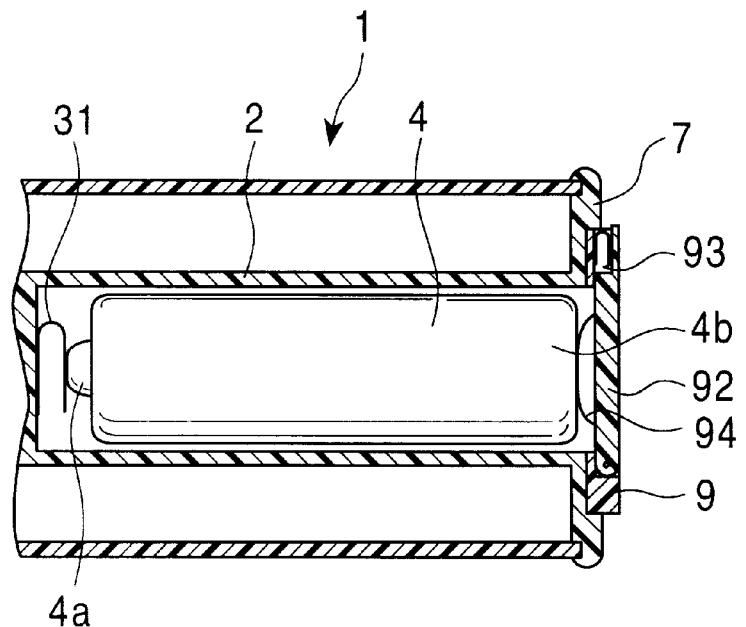
Figure 22B:
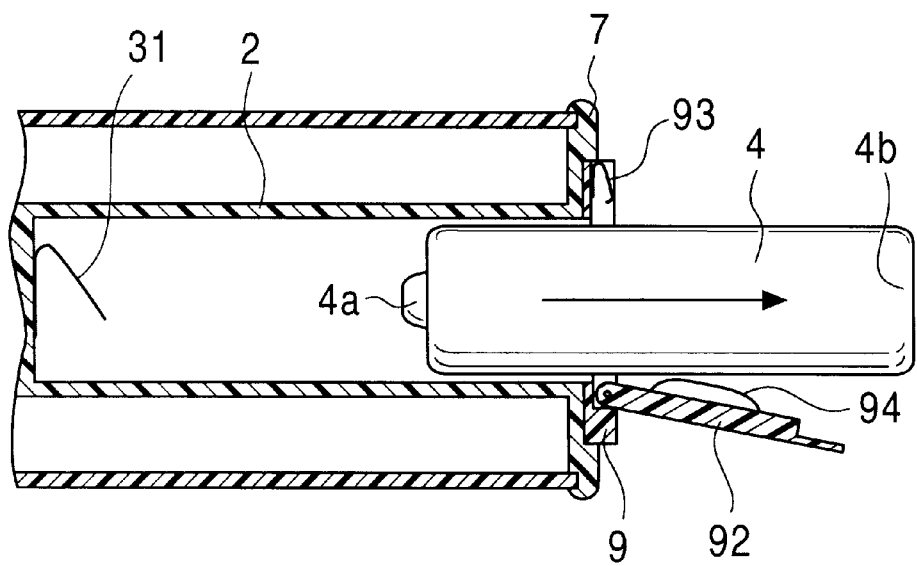

FIG. 20A is a longitudinal sectional view of the photovoltaic-charged secondary battery device in accordance with the fifth aspect, while FIG. 20B is a bottom plan view of the same. FIG. 21 is a fragmentary sectional view of the photovoltaic-charged secondary battery device, showing particularly a critical portion thereof, with a bottom lid opened. FIGS. 22A and 22B are longitudinal sectional views of the photovoltaic-charged secondary battery device, illustrative of a state in which a storage battery is accommodated in the photovoltaic-charged secondary battery device and a state in which the storage battery has been ejected to partly project from the photovoltaic-charged secondary battery device, respectively.

As in the cases of the preceding embodiments, the photovoltaic-charged secondary battery device 1 in accordance with the fifth aspect of the present invention has a cylindrical core 2, a flexible photoelectric transducer sheet 3 wound on the core 2 and adapted to be unrolled therefrom, a storage battery 4 provided in the core 2, and a control circuit 5. As will be seen from FIGS. 1 and 2, the photovoltaic-charged secondary battery device presents a generally cylindrical form when the photoelectric transducer sheet 3 has been fully wound on the core 2. As shown in FIG. 3, the photoelectric transducer sheet 3, when unrolled from the core 2 and developed is exposed to light rays so as to generate electricity with which the storage battery 4 is charged.

The photovoltaic-charged secondary battery device 1 also has upper and lower flanges 6 and 7 interconnected by the cylindrical core 2, and a peripheral wall member 51 coaxial with the core 2. The photoelectric transducer sheet 3 is connected at its one end to the core 2 and is adapted to be rolled on the core 2 so as to be received in an annular space defined between the core 2 and the peripheral wall member 51. The core 2 defines a cylindrical space which is divided by a ceiling member 2a of a conductive material into an upper space and a lower space. The upper space accommodates the control circuit 5. A leaf spring 31 made of a conductive material is attached to the lower face of the ceiling member 2a. The leaf spring 31 is held in electrical connection with a positive electrode terminal 8 of the photovoltaic-charged secondary battery device 1 through the ceiling member 2a. A battery insert hole 91 for inserting the storage battery into the photovoltaic-charged secondary battery device 1 is formed in the bottom wall of the core 2. An annular negative electrode terminal 9, serving also as a lid mounting member 9a, is secured to the lower flange 7 at a portion thereof near the battery insert hole 91.

A lid member, which is a bottom lid member in this case, denoted by 92, is hinged to a suitable portion of the peripheral edge of the lid mounting member 9a which also is made of an electrically conductive material. A conductive member 94 made of a leaf spring of a conductive material is secured to the inner surface of the bottom lid 92. A locking mechanism 93 for locking the bottom lid 92 is provided on the peripheral edge of the lid mount member 9a at a position diametrically opposing to the hinge of the bottom lid 92. The locking mechanism 93 has the form of a leaf spring made of a bimetal composed of a shape memory alloy and an ordinary resilient alloy, so as to be reversibly deform in accordance with change in temperature. Thus, the locking mechanism 93 is referred to also as a thermal deformation mechanism. As stated above, the locking mechanism preferably has elasticity so as to offer greater reliability of locking and unlocking function.

In use of the photovoltaic-charged secondary battery device 1, the storage battery 4 is inserted into the lower space in the core 2 through the battery insert hole 91. The lid member 92 is then swung to the closing position and is locked at the closing position by the locking mechanism 93. In this state, the positive electrode terminal 4a of the storage battery 4 and the negative electrode terminal 4b of the same are pressed y the leaf spring 31 and by the conductive member 94, respectively. Thus, in the state shown in FIG. 20A, the positive electrode terminal 4a of the storage battery 4 is held in electrical connection with the positive electrode terminal 8a of the photovoltaic-charged secondary battery device 1 via the leaf spring 31 and the ceiling plate 2a, while the negative electrode terminal 4b of the storage battery is held in electrical connection with the negative electrode terminal 9 of the photovoltaic-charged secondary battery device 1 via the conductive member 94, the lid member 92 and the locking mechanism 93. The positive electrode terminal 8 of the photovoltaic-charged secondary battery device 1 is arranged to project upward from the upper flange 6. The storage battery 4 is provided with a safety valve (not shown) at a position thereof near the positive electrode terminal 4a.

In operation, when the temperature of the photovoltaic-charged secondary battery device 1 has been raised to an abnormally high level, the locking mechanism 93 is thermally deformed to release and unlock the lid member 92, whereby the lid member 92 is freed to open. As a result, the storage battery 4 is forced out of the core 2 by the leaf spring 31 which constantly urges the storage battery 4 towards the lid member 92. The electrical connection between the positive electrode terminal 4a of the storage battery 4 and the leaf spring 41, i.e., the electrical connection between the terminal 4a and the positive electrode terminal 8 of the photovoltaic-charged secondary battery device 1, is therefore broken.

When the resilient force of the leaf spring 31 is considerably large, or when the photovoltaic-charged secondary battery device 1 is held upright as shown in FIG. 20A, the storage battery 4 is ejected from the core 2 at least partially or allowed to fall by gravity. FIG. 22A shows the photovoltaic-charged secondary battery device 1 which is disposed in a horizontal posture, with the storage battery 4 normally received therein, while FIG. 22B shows the photovoltaic-charged secondary battery device 1 from which the storage battery 4 has been ejected to partially project from the core 2. It will be seen that the electrical connection between the storage battery 4 and the associated member or mechanism is automatically broken as a result of the outward movement of the storage battery 4, even if the storage battery is ejected to project only partially. Obviously, the bimetal used as the material of the locking mechanism 93 may be substituted by a member which has the form of a leaf spring and which is made of a shape memory alloy alone. It is also possible to use a coiled spring in place of the leaf spring 31. The conductive member 94 also may be substituted by a conductive coiled spring.

When an automobile is parked for long time under the sunshine in summer season, the interior of the automobile is heated to a very high temperature. The photovoltaic-charged secondary battery device installed in an electrical appliance mounted in the dashboard of the automobile also is heated to an excessively high temperature so as to rupture or breakdown. In accordance with the described embodiment of the fifth aspect, however, such a rupture or breakdown is avoided because the storage battery is automatically ejected when the temperature is raised to such a high level. This offers improved safety in the use of the photovoltaic-charged secondary battery device, while minimizing the risk of damaging and contamination of the associated devices.

Although not shown, this embodiment of the fifth aspect may be provided with stripe-like or dot-like projections on the inner surface of the peripheral wall member 51 or on the surface of the photoelectric transducer sheet 3 opposing this inner surface, as in the case of the fourth embodiment described before.

Further, the photoelectric transducer sheet 3 used in this embodiment may be provided with a flexible polymeric cover sheet such as that the cover sheet 15 used in the first aspect of the present invention described before in connection with FIG. 5.

The photoelectric transducer sheet 3 also may have an inner end region near the end connected to the core 2, devoid of the photoelectric transducer elements 11 and carrying only the positive and negative electrode terminals 12a and 14a.

The photovoltaic-charged secondary battery device of this embodiment is so arranged that the light-receiving surface of the photoelectric transducer sheet 3 faces radially inward when the photoelectric transducer sheet 3 is rolled on the core 2. This, however, is not essential and the arrangement may be such that the light-receiving surface of the photoelectric transducer sheet 3 faces radially outward, provided that the risk of damaging of the photoelectric transducer elements is negligibly small, as in the cases of the preceding embodiments of the photovoltaic-charged secondary battery device. In such a case, the projections may be formed on the side reverse to the light-receiving surface.

Modification of First Embodiment

Figure 23A:
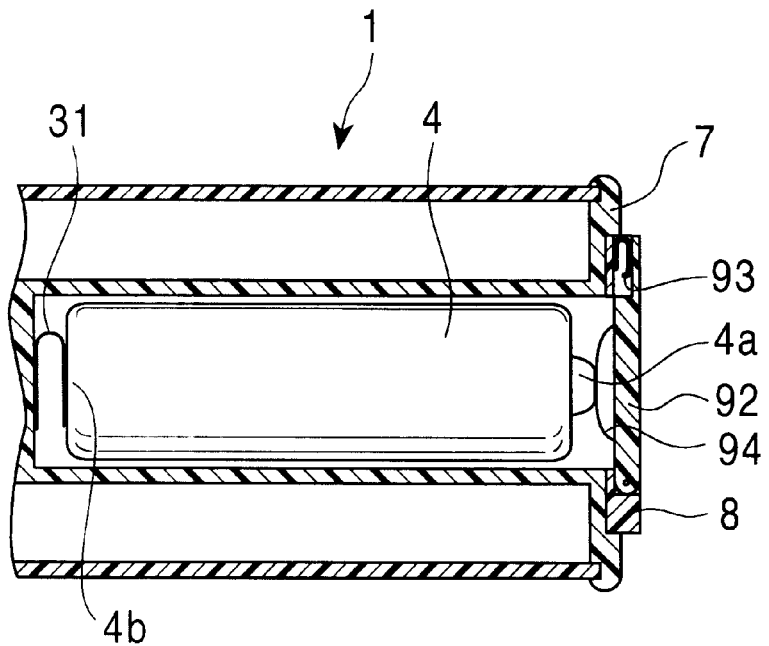
Figure 23B:
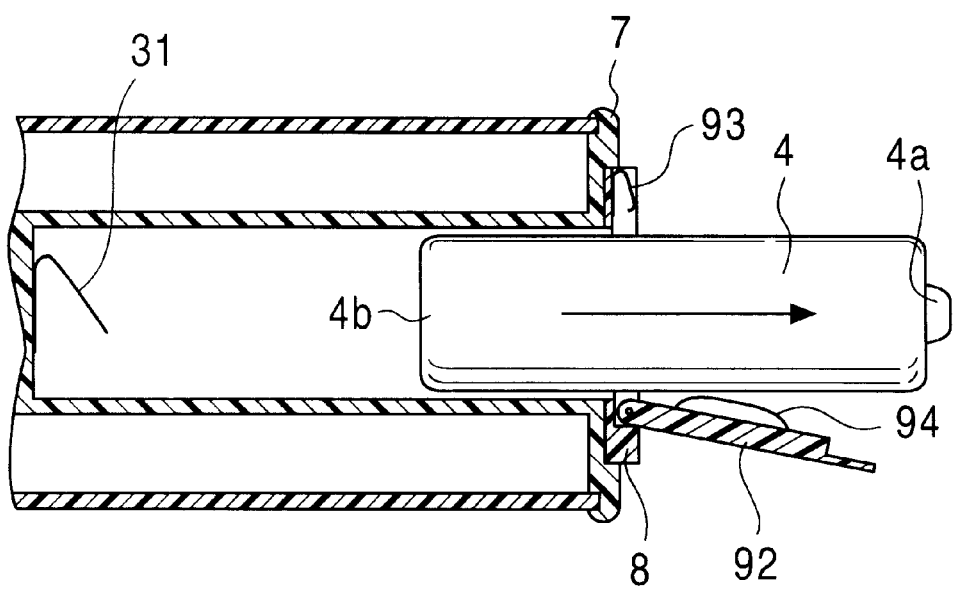

FIG. 23A shows a photovoltaic-charged secondary battery device 1 of the second embodiment of the fifth aspect, accommodating the storage battery 4 therein, while FIG. 23B shows the same photovoltaic-charged secondary battery device 1 with the storage battery 4 partially ejected from the photovoltaic-charged secondary battery device 1. In this modification, the storage battery 4 is mounted in a posture reverse to that of the first embodiment shown in FIGS. 22A and 22B. Namely, the storage battery 1 is set in the core 2 such that the negative electrode terminal 4b is pressed by the leaf spring 31 while the positive electrode terminal 4a is pressed by the conductive member 94. Thus, in the arrangement shown in FIGS. 23A and 23B, the positive electrode terminal 8 of FIGS. 22A, 22B serves as a negative electrode terminal (not shown), and the negative electrode terminal 9 of FIGS. 22A, 22B serves as a positive electrode terminal 8. Other portions of this modification are materially the same as those of the first embodiment shown in FIGS. 22A and 22B, and the operation and effects are the same as those of the first embodiment. As stated before, the storage battery 4 is provided with a safety valve (not shown) provided at a portion thereof near the positive electrode terminal. Therefore, in this modification, the risk of damaging and contamination of the photovoltaic-charged secondary battery device 1, attributable to blow-off of the internal chemical liquid from the safety valve if any, can be minimized advantageously.

Thus, as will be best seen from FIGS. 20A and 20B, a practical form of the photovoltaic-charged secondary battery device 1 in accordance with the fifth aspect comprises: a cylindrical core 2; a flexible photoelectric transducer sheet 3 which is extractably rolled on the core 2; a detachable and dischargeable/chargeable storage battery 4 chargeable through the photoelectric transducer sheet 3; and a control circuit 5 for controlling the discharging and charging operations. The photovoltaic-charged secondary battery device generally exhibits a substantially cylindrical form when the photoelectric transducer sheet 3 is fully rolled on the core 2. The photovoltaic-charged secondary battery device 1 further comprises a conductive spring 31 provided at one axial end of the core 2 and held in electrical connection with one 9 (or 8) of the two electrode terminals of the photovoltaic-charged secondary battery device; a battery insert hole 91 formed in the other axial end of the core 2; a lid mount member 9a provided on the edge of the battery insert hole 91 and serving also as the other 9 (or 8) of the electrode terminals of the photovoltaic-charged secondary battery device; a lid member 92 made of an electrically conductive material and hinged to the lid mount member 9a; and an electrically conductive lid locking member 93 attached to the lid mount member 9a and reversibly deformable in response to change in temperature; wherein the storage battery 4 is accommodated in a space defined in the core 2 with the lid member 92 locked in a closing position by the lid locking member 93, such that one 4a (or 4b) of its electrode terminals is pressed by the spring 31 while the other 4b (or 4a) of the electrode terminals held in electrical connection with the other 9 (or 8) of the electrode terminals of the photovoltaic-charged secondary battery device via the lid member or via the lid locking mechanism 93, the lid locking mechanism being thermally deformable to unlock the lid member 92 when the temperature thereof has been raised to a predetermined temperature.

In accordance with the first embodiment and its modification described above, when the temperature of the photovoltaic-charged secondary battery device has been raised to an abnormally high level, electrical connection between the photovoltaic-charged secondary battery device and associated member or mechanism is automatically broken or, alternatively, the storage battery is automatically ejected from the photovoltaic-charged secondary battery device. It is therefore possible to prevent damaging or breakdown of the photovoltaic-charged secondary battery device and associated devices, while preventing contamination of environment.

In the practical embodiment of the photovoltaic-charged secondary battery device in accordance with the fifth aspect, the spring 31 provided on one axial end of the core 2 constantly urges the storage battery 4, tending to eject the storage battery 4 from the space inside the core 2 through the battery insert hole 91. When the temperature of the photovoltaic-charged secondary battery device and, hence, of the storage battery 4 has been raised to an abnormally high temperature, the lid locking mechanism 33 is thermally deformed to unlock the lid member 92, thereby the storage battery 4 is forced out of the core by the force of the spring 31. This results in (1) automatic breakage of the electrical connection between the photovoltaic-charged secondary battery device and associated member or mechanism or, alternatively, automatic ejection of the storage battery from the photovoltaic-charged secondary battery device. It is therefore possible to prevent damaging or breakdown of the photovoltaic-charged secondary battery device and associated devices, while preventing contamination of environment.

Having described preferred embodiments of the present invention, it is to be noted that the described embodiments are only illustrative and various changes and modifications may be imparted thereto without departing from the scope of the present invention. It is also possible to implement the photovoltaic-charged secondary battery device of the present through a variety of combinations of various features of the described embodiments. All these changes, modifications and combinations fall within the scope of the present invention which is limited solely by the appended claims.

What is claimed is:

1. A photovoltaic-charged secondary battery device comprising:
    a cylindrical core;
    a flexible photoelectric transducer sheet extractably rolled on said core;
    a chargeable/dischargeable storage battery; and
    a control circuit for controlling the charging and discharging operations of said storage battery;
    said photovoltaic-charged secondary battery device with said photoelectric transducer sheet fully rolled on said core generally exhibiting a substantially cylindrical form;
    said photovoltaic-charged secondary battery device further comprising a polymeric cover film formed on at least the light-receiving surface of said photoelectric transducer sheet.

2. A photovoltaic-charged secondary battery device according to claim 1, comprising a plurality of photoelectric transducer elements formed on said photoelectric transducer sheet and arranged in parallel with the longitudinal axis of said photoelectric transducer sheet, said photoelectric transducer elements being electrically connected in series one to another.

3. A photovoltaic-charged secondary battery device according to claim 1, wherein said storage battery is accommodated in a space inside said core.

4. A photovoltaic-charged secondary battery device according to claim 1, wherein, when said photoelectric transducer sheet is fully rolled on said core, said photovoltaic-charged secondary battery device generally has dimensions and shape of a predetermined cylindrical standard battery.

5. A photovoltaic-charged secondary battery device according to claim 1, wherein said storage battery has a discharge voltage which is not less than 0.6 V and not higher than 1.9 V.

6. A photovoltaic-charged secondary battery device according to claim 1, wherein said storage battery is detachable from said space in said core.

7. A photovoltaic-charged secondary battery device comprising:
   a cylindrical core;
   a flexible photoelectric transducer sheet extractably rolled on said core;
   a chargeable/dischargeable storage battery; and
   a control circuit for controlling the charging and discharging operations of said storage battery;
   said photovoltaic-charged secondary battery device with said photoelectric transducer sheet fully rolled on said core generally exhibiting a substantially cylindrical form;
   wherein said photoelectric transducer sheet is arranged such that, when said photoelectric transducer sheet is rolled on said core, a light-receiving surface of said photoelectric transducer sheet faces outward of the roll.

8. A photovoltaic-charged secondary battery device according to claim 7, further comprising a polymeric cover film formed on at least said light-receiving surface of said photoelectric transducer sheet.

9. A photovoltaic-charged secondary battery device according to claim 7, comprising a plurality of photoelectric transducer elements formed on said photoelectric transducer sheet and arranged in parallel with the longitudinal axis of said photoelectric transducer sheet, said photoelectric transducer elements being electrically connected in series one to another.

10. A photovoltaic-charged secondary battery device according to claim 7, wherein said storage battery is accommodated in a space inside said core.

11. A photovoltaic-charged secondary battery device according to claim 7, wherein, when said photoelectric transducer sheet is fully rolled on said core, said photovoltaic-charged secondary battery device generally has dimensions and shape of a predetermined cylindrical standard battery.

12. A photovoltaic-charged secondary battery device according to claim 7, wherein said storage battery has a discharge voltage which is not less than 0.6 V and not higher than 1.9 V.

13. A photovoltaic-charged secondary battery device according to claim 7, wherein said storage battery is detachable from said space in said core.

14. A photovoltaic-charged secondary battery device according to claim 7, wherein said storage battery has the dimensions and shape of a predetermined cylindrical standard battery.

15. A photovoltaic-charged secondary battery device comprising:
   a cylindrical core;
   a flexible photoelectric transducer sheet extractably rolled on said core;
   a chargeable/dischargeable storage battery; and
   a control circuit for controlling the charging and discharging operations of said storage battery;
   said photovoltaic-charged secondary battery device with said photoelectric transducer sheet fully rolled on said core generally exhibiting a substantially cylindrical form;
   said photovoltaic-charged secondary battery device further comprising:
   substantially flat, disk-shaped upper and lower flanges provided on both ends of said core; and
   a peripheral wall member disposed between and rotatably supported by said upper and lower flanges, said peripheral wall member and said core defining therebetween an annular space for accommodating said photoelectric transducer sheet rolled on said core, said peripheral wall member having a slit through which said photoelectric transducer sheet is extracted and retracted, such that rotation of said peripheral wall member causes said photoelectric transducer sheet to be retracted into said annular space and rolled on said core, said photoelectric transducer sheet having an inner end region having a length large enough to space the inner end of effective photovoltaic portion of said photoelectric transducer sheet to be sufficiently spaced apart from said slit when said photoelectric transducer sheet is extracted from said annular space.

16. A photovoltaic-charged secondary battery device according to claim 15, wherein, when said photoelectric transducer sheet is fully rolled on said core, said photovoltaic-charged secondary battery device generally has dimensions and shape of a predetermined cylindrical standard battery.

17. A photovoltaic-charged secondary battery device according to claim 15, wherein said storage battery has a discharge voltage which is not less than 0.6 V and not higher than 1.9 V.

18. A photovoltaic-charged secondary battery device according to claim 15, wherein said storage battery is detachable from said core.

19. A photovoltaic-charged secondary battery device comprising:
   a cylindrical core;
   a flexible photoelectric transducer sheet extractably rolled on said core;
   a chargeable/dischargeable storage battery; and
   a control circuit for controlling the charging and discharging operations of said storage battery;
   said photovoltaic-charged secondary battery device with said photoelectric transducer sheet fully rolled on said core generally exhibiting a substantially cylindrical form;
   said photovoltaic-charged secondary battery device further comprising:
   substantially flat, disk-shaped upper and lower flanges provided on both ends of said core; and
   a peripheral wall member disposed between and rotatably supported by said upper and lower flanges, said peripheral wall member and said core defining therebetween an annular space for accommodating said photoelectric transducer sheet rolled on said core, said peripheral wall member having a slit through which said photoelectric transducer sheet is extracted and retracted, such that rotation of said peripheral wall member causes said photoelectric transducer sheet to be retracted into said annular space and rolled on said core, said peripheral wall member further having a plurality of projections on the inner surface thereof.

20. A photovoltaic-charged secondary battery device according to claim 19, wherein, when said photoelectric transducer sheet is fully rolled on said core, said photovoltaic-charged secondary battery device generally has dimensions and shape of a predetermined cylindrical standard battery.

21. A photovoltaic-charged secondary battery device according to claim 20, wherein said storage battery has a discharge voltage which is not less than 0.6 V and not higher than 1.9 V.

22. A photovoltaic-charged secondary battery device according to claim 20, wherein said storage battery is detachable from said core.

23. A photovoltaic-charged secondary battery device according to claim 20, wherein said photoelectric transducer sheet is arranged such that, when said photoelectric transducer sheet is rolled on said core, a light-receiving surface of said photoelectric transducer sheet faces inward of the roll.

24. A photovoltaic-charged secondary battery device comprising:
   a cylindrical core;
   a flexible photoelectric transducer sheet extractably rolled on said core;
   a chargeable/dischargeable storage battery; and
   a control circuit for controlling the charging and discharging operations of said storage battery;
   said photovoltaic-charged secondary battery device with said photoelectric transducer sheet fully rolled on said core generally exhibiting a substantially cylindrical form;
   said photovoltaic-charged secondary battery device further comprising:
   substantially flat, disk-shaped upper and lower flanges provided on both ends of said core; and
   a peripheral wall member disposed between and rotatably supported by said upper and lower flanges, said peripheral wall member and said core defining therebetween an annular space for accommodating said photoelectric transducer sheet rolled on said core, said peripheral wall member having a slit through which said photoelectric transducer sheet is extracted and retracted, such that rotation of said peripheral wall member causes said photoelectric transducer sheet to be retracted into said annular space and rolled on said core, said photoelectric transducer sheet having a plurality of projections formed on the surface thereof facing the inner surface of said peripheral wall member.

25. A photovoltaic-charged secondary battery device according to claim 24, wherein, when said photoelectric transducer sheet is fully rolled on said core, said photovoltaic-charged secondary battery device generally has dimensions and shape of a predetermined cylindrical standard battery.

26. A photovoltaic-charged secondary battery device according to claim 25, wherein said storage battery has a discharge voltage which is not less than 0.6 V and not higher than 1.9 V.

27. A photovoltaic-charged secondary battery device according to claim 25, wherein said storage battery is detachable from said core.

28. A photovoltaic-charged secondary battery device according to claim 25, wherein said projections are formed on the surface of said photoelectric transducer sheet opposite to the light-receiving surface thereof, and said photoelectric transducer sheet is arranged such that, when said photoelectric transducer sheet is rolled on said core, said light-receiving surface of said photoelectric transducer sheet faces inward of the roll.

29. A photovoltaic-charged secondary battery device comprising:
   a cylindrical core;
   a flexible photoelectric transducer sheet extractably rolled on said core;
   a detachable storage battery chargeable through said photoelectric transducer sheet and capable of discharging;
   a control circuit for controlling the charging and discharging operations of said storage battery; and
   a temperature-responsive mechanism;
   said photovoltaic-charged secondary battery device with said photoelectric transducer sheet fully rolled on said core generally exhibiting a substantially cylindrical form;
   said temperature-responsive mechanism being operable to break electrical connection between said storage battery and an associated member when the temperature thereof has been raised to a predetermined high temperature.

30. A photovoltaic-charged secondary battery device according to claim 29, wherein, when said photoelectric transducer sheet is fully rolled on said core, said photovoltaic-charged secondary battery device generally has dimensions and shape of a predetermined cylindrical standard battery.

31. A photovoltaic-charged secondary battery device according to claim 29, wherein said storage battery has a discharge voltage which is not less than 0.6 V and not higher than 1.9 V.

32. A photovoltaic-charged secondary battery device according to claim 29, wherein said storage battery has the dimensions and shape of a predetermined cylindrical standard battery.

33. A photovoltaic-charged secondary battery device comprising:
   a cylindrical core;
   a flexible photoelectric transducer sheet extractably rolled on said core;
   a detachable storage battery chargeable through said photoelectric transducer sheet and capable of discharging;
   a control circuit for controlling the charging and discharging operations of said storage battery; and
   a temperature-responsive mechanism;
   said photovoltaic-charged secondary battery device with said photoelectric transducer sheet fully rolled on said core generally exhibiting a substantially cylindrical form;
   said temperature-responsive mechanism being operable to cause said storage battery to be moved apart from a predetermined position when the temperature thereof has been raised to a predetermined high temperature.

34. A photovoltaic-charged secondary battery device according to claim 33, wherein, when said photoelectric transducer sheet is fully rolled on said core, said photovoltaic-charged secondary battery device generally has dimensions and shape of a predetermined cylindrical standard battery.

35. A photovoltaic-charged secondary battery device according to claim 33, wherein said storage battery has a discharge voltage which is not less than 0.6 V and not higher than 1.9 V.

36. A photovoltaic-charged secondary battery device according to claim 33, wherein said storage battery has the dimensions and shape of a predetermined cylindrical standard battery.

37. A photovoltaic-charged secondary battery device, comprising:
a cylindrical core;
a flexible photoelectric transducer sheet which is extractably rolled on said core;
a detachable and dischargeable/chargeable storage battery chargeable through said photoelectric transducer sheet;
and a control circuit for controlling the discharging and charging operations;
said photovoltaic-charged secondary battery device generally exhibiting a substantially cylindrical form when said photoelectric transducer sheet is fully rolled on said core and further comprising:
a conductive spring provided at one axial end of said core and held in electrical connection with one of the two electrode terminals of said photovoltaic-charged secondary battery device;
a battery insert hole formed in the other axial end of said core;
a lid mount member provided on the edge of the battery insert hole and serving also as the other of the electrode terminals of said photovoltaic-charged secondary battery device;
a lid member made of an electrically conductive material and hinged to said lid mount member;
and a lid locking member attached to said lid mount member and reversibly deformable in response to change in temperature;
wherein said storage battery is accommodated in a space defined in said core with said lid member locked in a closing position by said lid locking member, such that one of the electrode terminals of said storage battery is pressed by said spring while the other of the electrode terminals is held in electrical connection with the other of the electrode terminals of said photovoltaic-charged secondary battery device via said lid member, said lid locking mechanism being thermally deformable to unlock said lid member when the temperature thereof has been raised to a predetermined temperature.

38. A photovoltaic-charged secondary battery device according to claim 37, wherein said lid locking mechanism comprises a leaf-spring-like member formed of a bimetal composed of a shape memory alloy and an alloy having high resiliency.

* * * * *